(12) United States Patent
Shibazaki

(10) Patent No.: US 10,658,157 B2
(45) Date of Patent: May 19, 2020

(54) EXPOSURE APPARATUS AND EXPOSURE METHOD, LITHOGRAPHY METHOD, AND DEVICE MANUFACTURING METHOD

(71) Applicant: NIKON CORPORATION, Tokyo (JP)

(72) Inventor: Yuichi Shibazaki, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/085,142

(22) PCT Filed: Mar. 14, 2017

(86) PCT No.: PCT/JP2017/010249
§ 371 (c)(1),
(2) Date: Sep. 14, 2018

(87) PCT Pub. No.: WO2017/159693
PCT Pub. Date: Sep. 21, 2017

(65) Prior Publication Data
US 2019/0074161 A1 Mar. 7, 2019

(30) Foreign Application Priority Data
Mar. 14, 2016 (JP) .................................. 2016-049177

(51) Int. Cl.
*H01J 37/00* (2006.01)
*H01J 37/317* (2006.01)
(Continued)

(52) U.S. Cl.
CPC ...... *H01J 37/3174* (2013.01); *G02B 27/0938* (2013.01); *G03F 7/20* (2013.01);
(Continued)

(58) Field of Classification Search
CPC . H01J 37/3174; H01J 37/305; H01L 21/0274; H01L 21/027; G02B 27/0938;
(Continued)

(56) References Cited

U.S. PATENT DOCUMENTS 5,770,863 A * 6/1998 Nakasuji ................ B82Y 10/00
250/396 R
6,274,877 B1 * 8/2001 Muraki .................. B82Y 10/00
250/492.2
(Continued)

FOREIGN PATENT DOCUMENTS

JP 2015-133400 A 7/2015
WO 2007/077920 A1 7/2007

OTHER PUBLICATIONS

Jun. 20, 2017 International Search Report issued in International Patent Application No. PCT/JP2017/010249.
Jun. 20, 2017 Written Opinion issued in International Patent Application No. PCT/JP2017/010249.

*Primary Examiner* — Michael Maskell
(74) *Attorney, Agent, or Firm* — Oliff PLC

(57) ABSTRACT

An exposure apparatus scans a substrate in a Y-axis direction and also adjusts irradiation position of a plurality of beams, based on correction information obtained from the same number of distortion tables as the beams, the distortion tables including information concerning change of irradiation position of the plurality of beams of a multibeam optical system. Especially, the irradiation position of the plurality of beams in the Y-axis direction is adjusted by individually controlling irradiation timing of the plurality of beams irradiated on the substrate from the multibeam optical system.

24 Claims, 13 Drawing Sheets

(51) Int. Cl.
*G03F 7/20* (2006.01)
*H01L 21/027* (2006.01)
*H01J 37/302* (2006.01)
*G02B 27/09* (2006.01)

(52) U.S. Cl.
CPC ...... *H01J 37/3023* (2013.01); *H01J 37/3177* (2013.01); *H01L 21/027* (2013.01); *H01L 21/0274* (2013.01); *H01J 2237/0435* (2013.01); *H01J 2237/30461* (2013.01); *H01J 2237/31754* (2013.01); *H01J 2237/31769* (2013.01)

(58) Field of Classification Search
CPC .... G03F 7/20; G03F 7/70775; G03F 7/70716; G03F 7/70533; G03F 7/705; G03F 7/2004
USPC ........................................... 250/492.1–492.3
See application file for complete search history.

(56) References Cited

U.S. PATENT DOCUMENTS

| | | | | |
|---|---|---|---|---|
| 6,784,442 | B2* | 8/2004 | Muraki | B82Y 10/00 |
| | | | | 250/396 ML |
| 7,005,658 | B2* | 2/2006 | Muraki | B82Y 10/00 |
| | | | | 250/492.1 |
| 7,561,280 | B2 | 7/2009 | Schluchter et al. | |
| 8,148,702 | B2* | 4/2012 | Doering | B82Y 10/00 |
| | | | | 250/310 |
| 9,305,740 | B2* | 4/2016 | Frosien | H01J 37/045 |
| 2003/0141462 | A1* | 7/2003 | Hartley | B82Y 10/00 |
| | | | | 250/492.23 |
| 2007/0206170 | A1 | 9/2007 | Ebihara | |
| 2015/0200074 | A1 | 7/2015 | Hamaguchi et al. | |
| 2016/0027611 | A1* | 1/2016 | Ookawa | H01J 37/3174 |
| | | | | 250/492.3 |

\* cited by examiner

EXPOSURE APPARATUS AND EXPOSURE METHOD, LITHOGRAPHY METHOD, AND DEVICE MANUFACTURING METHOD

TECHNICAL FIELD

The present invention relates to exposure apparatuses and exposure methods, lithography methods, and device manufacturing methods, and more particularly to an exposure apparatus and an exposure method to expose a target by irradiating the target with a charged particle beam, a lithography method to perform cutting of a line pattern using the exposure apparatus or the exposure method, and a device manufacturing method including a lithography process in which exposure is performed on a target according to the lithography method.

BACKGROUND ART

In recent years, proposals are made on complementary lithography that complementarily uses, for example, a liquid immersion exposure technique using an ArF light source and a charged particle beam exposure technique (e.g., electron beam exposure technique). In complementary lithography, for example, by using double patterning and the like in liquid immersion exposure using the ArF light source, a simple line-and-space pattern (hereinafter shortly referred to as an L/S pattern) is formed. Then, line pattern cutting and via formation are performed through exposure using the electron beam.

In complementary lithography, a charged particle beam exposure apparatus equipped with a multibeam optical system can be suitably used (for example, refer to PTL 1 and PTL 2). However, a Coulomb force (Coulomb interaction) acts among a plurality of beams irradiated from the multibeam optical system. In addition, in the case when exposure is actually performed, on/off state of each of the plurality of beams changes freely every moment according to a target pattern. As a consequence, it can be considered that interaction of beams in an on state also changes freely every moment and that positional relation on an irradiation surface of the plurality of beams changes from an intended positional relation.

CITATION LIST

Patent Literature

[PTL 1] Japanese Unexamined Patent Application Publication No. 2015-133400
[PTL 2] U.S. Patent Application Publication No. 2015/0200074

SUMMARY OF INVENTION

According to a first aspect of the present invention, there is provided an exposure apparatus that irradiates a charged particle beam to expose a target, comprising: a stage that moves holding the target; an irradiation device that has a multibeam optical system which can individually set an irradiation state of the beam irradiated on the target for a plurality of beams; and a controller that controls relative movement between the stage and the multibeam optical system, and also adjusts an irradiation position of the plurality of beams with respect to the target, based on information concerning change in an irradiation position of a second beam which occurs based on an irradiation state of at least a first beam of the plurality of beams.

According to a second aspect of the present invention, there is provided a lithography method, comprising: exposing a target with an exposure apparatus and forming a line-and-space pattern on the target; and performing cutting of a line pattern that structures the line-and-space pattern using the exposure apparatus according to the first aspect.

According to a third aspect of the present invention, there is provided an exposure method of irradiating and exposing a target with a charged particle beam, comprising: making a stage that moves within a predetermined plane hold a target; and irradiating and controlling a beam on the target from an irradiation device having a multibeam optical system that can individually set an irradiation state of the beam irradiated on the target for a plurality of beams, by controlling relative movement between the stage and the multibeam optical system, and adjusting an irradiation position of the plurality of beams on the target based on information concerning change in an irradiation position of a second beam which occurs based on an irradiation state of at least a first beam of the plurality of beams.

According to a fourth aspect of the present invention, there is provided a lithography method, comprising: exposing a target with an exposure apparatus and forming a line-and-space pattern on the target; and performing cutting of a line pattern that structures the line-and-space pattern using the exposure method according to the third aspect.

According to a fifth aspect of the present invention, there is provided a device manufacturing method including a lithography process, wherein in the lithography process, exposure with respect to the target is performed by the lithography method according to one of the second aspect and the fourth aspect.

BRIEF DESCRIPTION OF DRAWINGS

FIG. 2 is a perspective view showing an exposure system that the electron beam exposure apparatus in FIG. 1 is equipped with.

DESCRIPTION OF EMBODIMENTS

Figure 1:
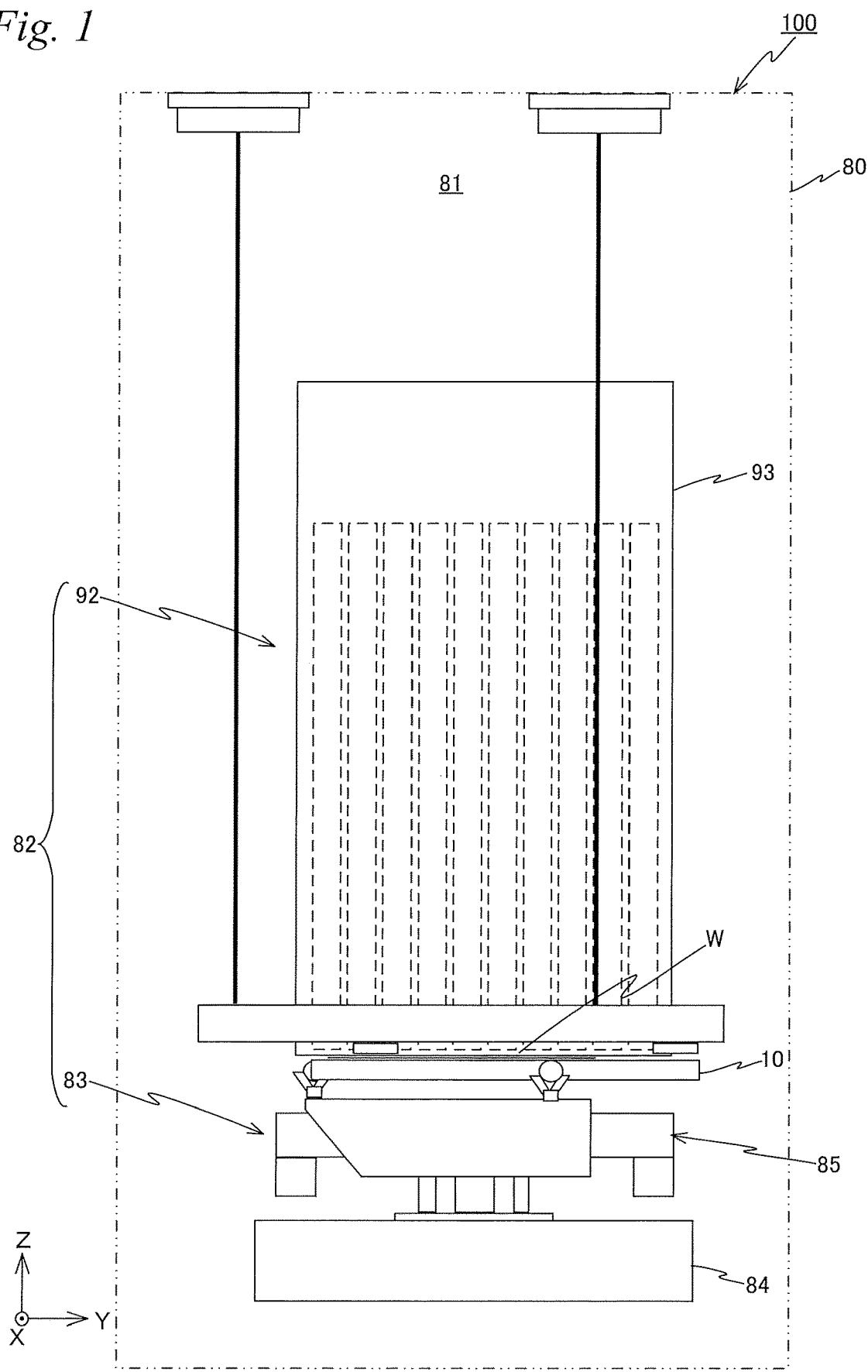
FIG. 1 is a view schematically showing a structure of an electron beam exposure apparatus according to an embodiment.

Hereinafter, an embodiment will be described, based on FIGS. 1 to 13B. FIG. 1 schematically shows a structure of an electron beam exposure apparatus 100 according to the embodiment. Electron beam exposure apparatus 100 is equipped with an electron beam optical system as it will be described later on, therefore, in the description below, a Z-axis will be taken parallel to an optical axis of the electron beam optical system, a scanning direction in which wafer W is moved at the time of exposure to be described later on within a plane perpendicular to the Z-axis will be described as a Y-axis direction, a direction orthogonal to the Z-axis and the Y-axis will be described as an X-axis direction, and rotation (tilt) directions around the X-axis, the Y-axis, and the Z-axis will be described as θx direction, θy direction, and θz direction, respectively.

In the embodiment, a structure using an electron beam will be described as an example of a charged particle beam. However, the charged particle beam is not limited to the electron beam, and may also be a beam using a charged particle such as an ion beam.

Figure 2:
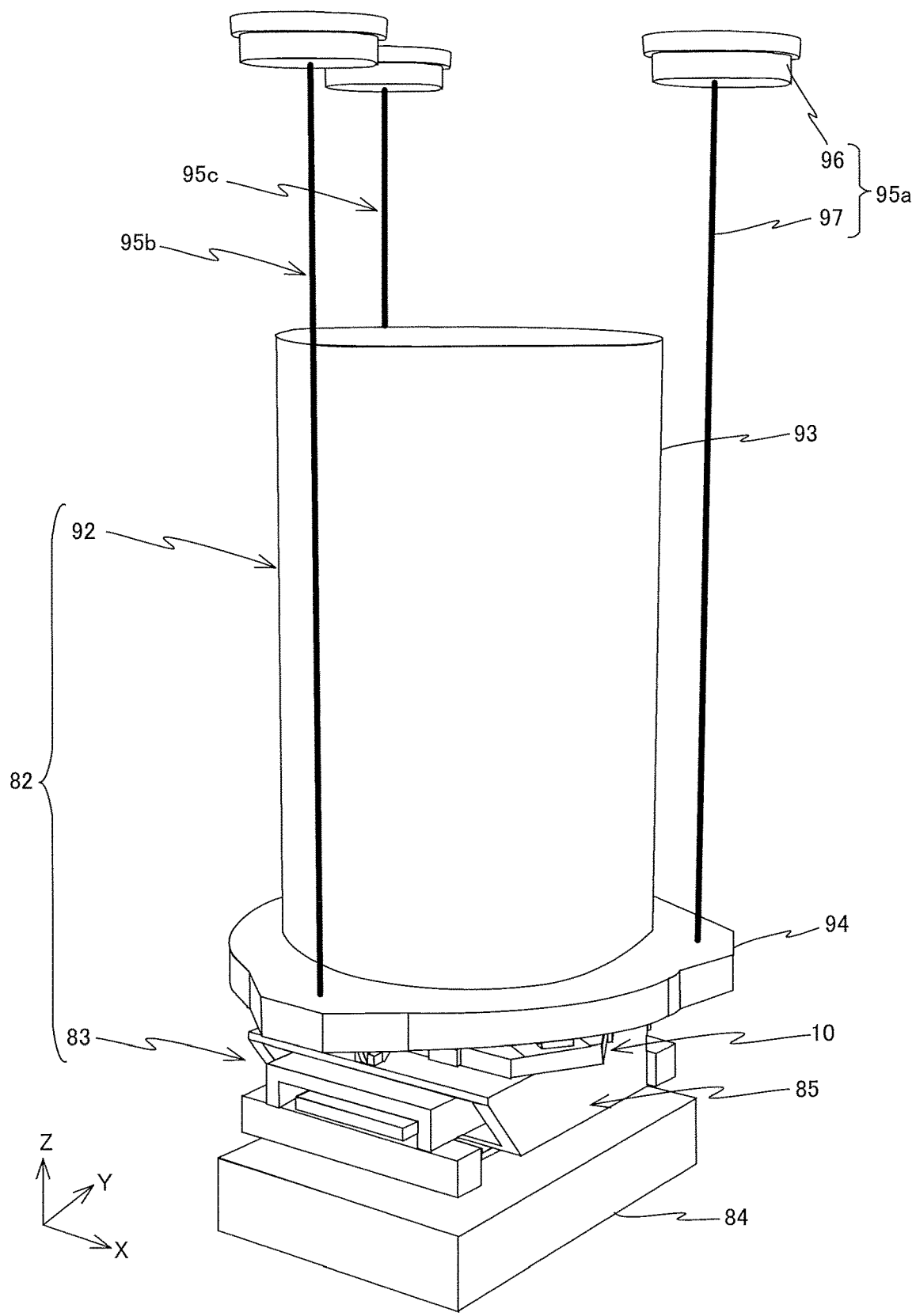

Electron beam exposure apparatus 100 is equipped with a vacuum chamber 80, and an exposure system 82 housed inside an exposure chamber 81 partitioned by vacuum chamber 80. FIG. 2 shows a perspective view of exposure system 82.

Exposure system 82 is equipped with a stage device 83 and an electron beam irradiation device 92, as is shown in FIGS. 1 and 2. Electron beam irradiation device 92 includes a cylindrical barrel 93 shown in FIG. 2 and an electron beam optical system inside barrel 93.

Stage device 83 has a structure including a coarse/fine movement stage 85 freely detachable from a wafer shuttle 10 that can move holding a wafer, and electron beam irradiation device 92 has a structure in which exposure of a wafer W held by wafer shuttle 10 attached to coarse/fine movement stage 85 is performed irradiating an electron beam on wafer W.

Here, wafer shuttle 10 to be described in detail later on is a holding member (or a table) that holds the wafer by electrostatic suction. This holding member is carried in a state holding the wafer, and repeatedly moves back and forth like a shuttle bus (or a space shuttle) between a plurality of exposure chambers (exposure chambers other than exposure chamber 81 are not shown) including exposure chamber 81, with a measurement chamber (not shown) where a predetermined pre-measurement is performed serving as a starting point. Therefore, in the embodiment, the holding member is also referred to as a wafer shuttle.

Stage device 83, as is shown in FIG. 2, is equipped with a surface plate 84, coarse/fine movement stage 85 that moves on surface plate 84, a drive system that moves coarse/fine movement stage 85, and a position measurement system that measures position information of coarse/fine movement stage 85. Details on structure and the like of stage device 83 will be described later on.

Barrel 93 of electron beam irradiation device 92, as is shown in FIG. 2, is supported from below by a metrology frame 94 consisting of an annular plate member on which three projecting sections are formed at an outer periphery section with the central angle at an interval of 120 degrees. More specifically, the lowest end section of barrel 93 is a small diameter section whose diameter is smaller than the part above the lowest end section, and the boundary between the small diameter section and the part above is a step section. And, the small diameter section is inserted inside a circular opening of metrology frame 94, and barrel 93 is supported from below by metrology frame 94 in a state where the bottom surface of the step section is in contact with the upper surface of metrology frame 94. Metrology frame 94, as is shown in FIG. 2, is supported in a state suspended from a top plate (ceiling wall) of vacuum chamber 80 that partitions exposure chamber 81, via three suspension support mechanisms 95a, 95b, and 95c (connecting members with a flexible structure) whose lower ends are connected to the three projecting sections described earlier, respectively (refer to FIG. 1). That is, electron beam irradiation device 92 is supported by suspension at three points with respect to vacuum chamber 80 in this manner.

The three suspension support mechanisms 95a, 95b, and 95c, as is representatively shown about suspension support mechanisms 95a in FIG. 2, each have a passive vibration isolation pad 96 provided at its upper end, and a wire 97 made of steel that has one end connected to the lower end of vibration isolation pad (vibration isolation section) 96 and the other end connected to metrology frame 94. Vibration isolation pads 96, which are fixed to the top plate of vacuum chamber 80, each include an air damper or a coil spring.

In the embodiment, of vibration such as floor vibration and the like transmitted from the outside to vacuum chamber 80, since a large part of the vibration component in the Z-axis direction parallel to the optical axis of the electron beam optical system is absorbed by vibration isolation pad 96, high vibration isolation performance can be achieved in a direction parallel to the optical axis of the electron beam optical system. Also, natural frequency of the suspension support mechanism is lower in a direction perpendicular to the optical axis than the direction parallel to the optical axis of the electron beam optical system. Since the three suspension support mechanisms 95a, 95b, and 95c swing like a pendulum in the direction perpendicular to the optical axis, the length of the three suspension support mechanisms 95a, 95b, and 95c (the length of wire 97) is set long enough so that vibration isolation performance (capacity of preventing vibration such as floor vibration transmitted from the outside of vacuum chamber 80 being transmitted to electron beam irradiation device 92) in the direction perpendicular to the optical axis is sufficiently high. With this structure, while high vibration isolation performance can be achieved along with the weight of a mechanical section being largely reduced, relative position between electron beam irradiation device 92 and vacuum chamber 80 may change in a comparatively low frequency. Therefore, a positioning device 98 of a non-contact method (not shown in FIGS. 1 and 2, refer to FIG. 11) is provided to maintain the relative position between electron beam irradiation device 92 and vacuum chamber 80 in a predetermined state. This positioning device 98 can be structured including a six-axis acceleration sensor and a six-axis actuator, as is disclosed in, for example, International Publication WO 2007/077920 and the like. Positioning device 98 is controlled by a main controller 50

Figure 11:
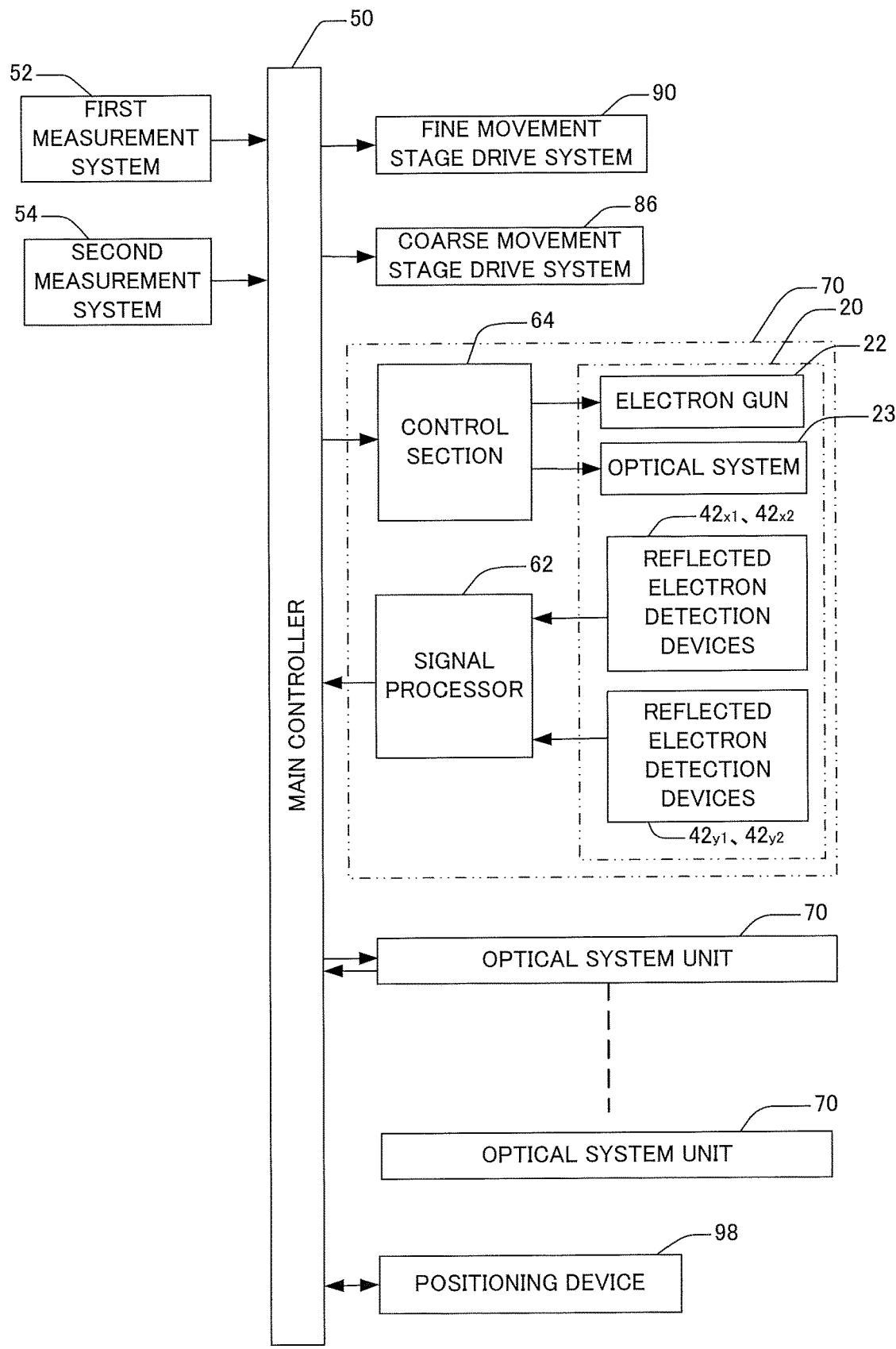
FIG. 11 is a block diagram showing an input/output relation of a main controller that structures a control system of the electron beam exposure apparatus.

(refer to FIG. 11). This allows relative position of electron beam irradiation device 92 in the X-axis direction, the Y-axis direction, and the Z-axis direction with respect to vacuum chamber 80 and relative rotation angle around the X-axis, the Y-axis, and the Z-axis to be maintained at a constant state (predetermined state).

Figure 3:
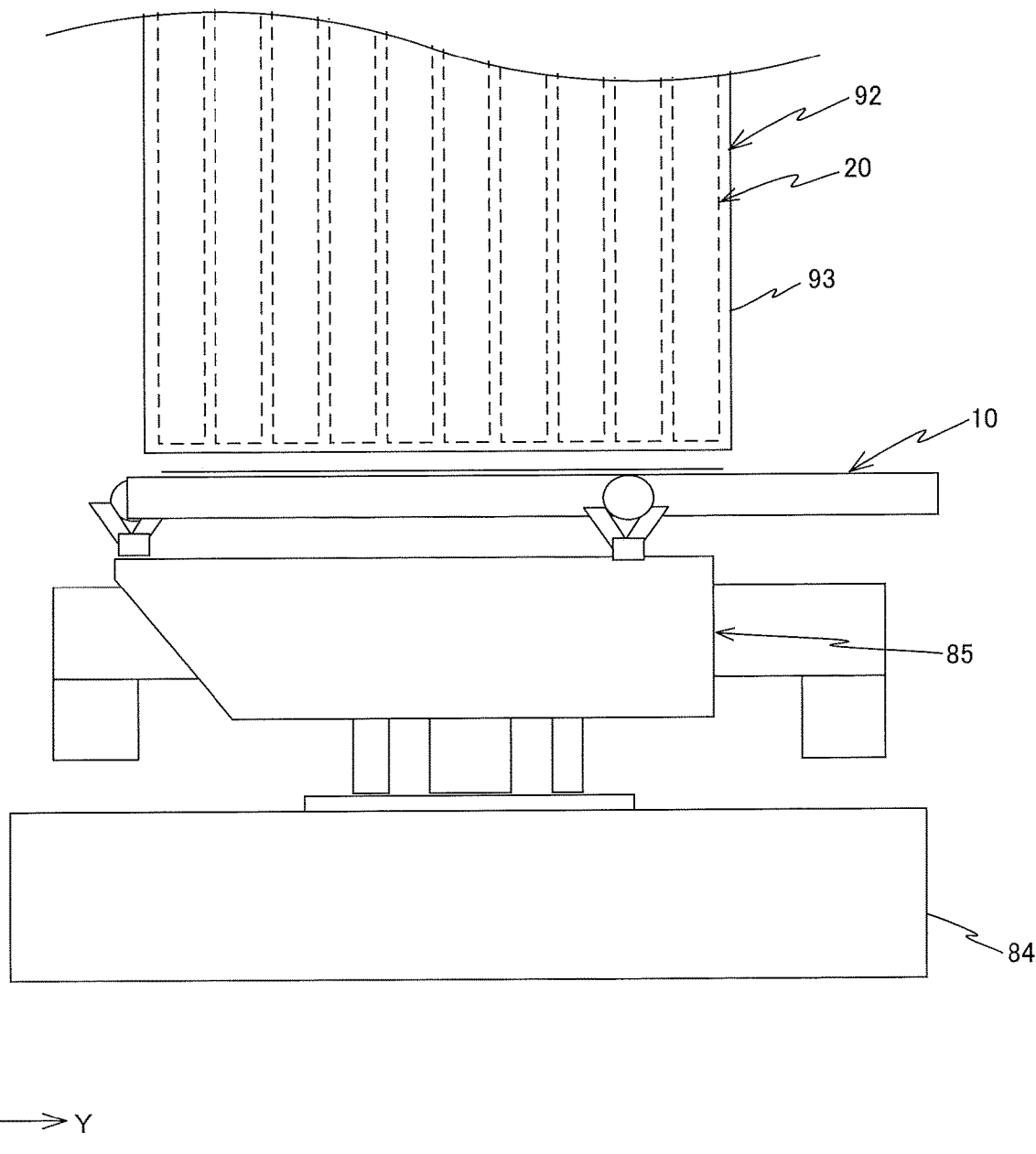
FIG. 3 is a view showing a part of an electron beam irradiation device, along with a coarse/fine movement stage to which a wafer shuttle is attached.

FIG. 3 shows a part of electron beam irradiation device 92, along with coarse/fine movement stage 85 to which shuttle 10 is attached. Illustration of metrology frame 94 is omitted in FIG. 3. Electron beam irradiation device 92 is equipped with barrel 93 and the electron beam optical system structured from m (e.g., m is 100) optical system columns 20 arranged in the shape of an array in the XY plane within barrel 93. Each optical system column 20 includes a multibeam optical system that can be individually turned on/off, and can irradiate n beams (e.g., n is 5000) that can be deflected. In the description below, for convenience, the multibeam optical system will be written as multibeam optical system 20, optical system column (multibeam optical system) 20, or multibeam optical system (optical system column) 20, using the same code as the optical system column.

Figure 4:
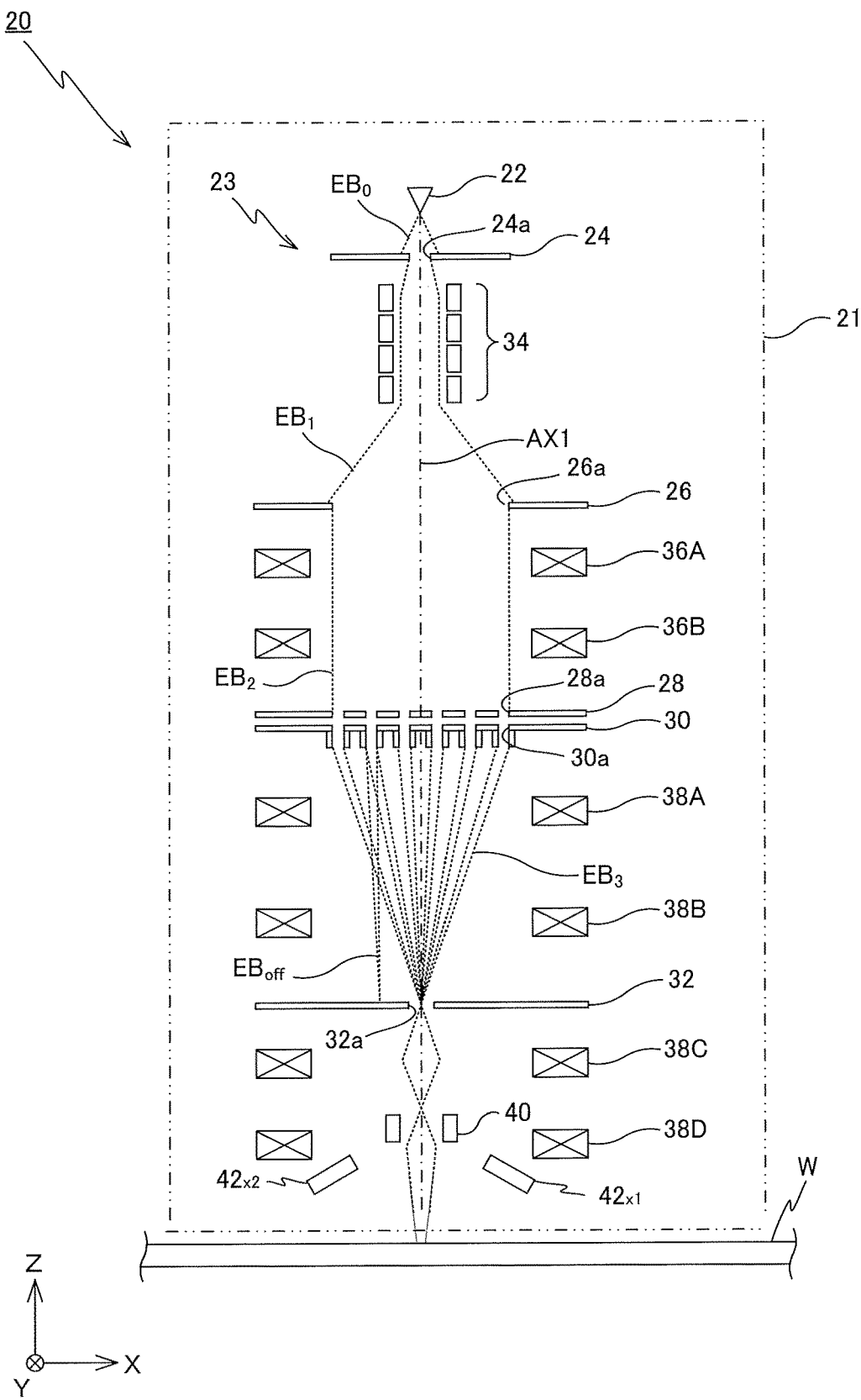
FIG. 4 is a view showing a structure of an optical system column (multibeam optical system).

FIG. 4 shows a structure of optical system column (multibeam optical system) 20. Optical system column (multibeam optical system) 20 is equipped with a cylindrical housing (column cell) 21, an electron gun 22 housed in column cell 21, and an optical system 23. Optical system column (multibeam optical system) 20 is equipped with a cylindrical housing (column cell) 21, an electron gun 22 housed in column cell 21, and an optical system 23.

Optical system 23 is equipped with a first aperture plate 24, a primary beam forming plate 26, a beam forming aperture plate 28, a blanker plate 30, and a final aperture 32, arranged below electron gun 22 sequentially from top to bottom in a predetermined positional relation. Of these parts, beam forming aperture plate 28 and blanker plate 30 are arranged close together.

In between the first aperture plate 24 and primary beam forming plate 26, an asymmetrical illumination optical system 34 is arranged. Also, in between primary beam forming plate 26 and beam forming aperture plate 28, electromagnetic lenses 36A and 36B are arranged in a vertical direction at a predetermined spacing. In between blanker plate 30 and final aperture 32, electromagnetic lenses 38A and 38B are arranged in a vertical direction at a predetermined spacing. Also, below final aperture 32, electromagnetic lenses 38C and 38D are arranged in a vertical direction at a predetermined spacing. At the inner side of electromagnetic lenses 38D, a stage feedback deflector 40 is arranged at a slightly high position and almost concentric with electromagnetic lens 38D.

From electron gun 22, an electron beam $EB_0$ of a predetermined accelerating voltage (e.g., 50 keV) is emitted. Electron beam $EB_0$ is formed into a circular sectional shape symmetric around optical axis AX1 by passing an aperture 24a of the first aperture plate 24.

Asymmetrical illumination optical system 34 generates an electron beam $EB_1$, which is a beam whose cross sectional shape is changed from that of electron beam $EB_0$ having a circular cross-section into a longitudinal shape elongated in one direction (e.g., the X-axis direction) and shortened in another direction (e.g., the Y-axis direction).

Asymmetrical illumination optical system 34 can be structured, for example, by an electrostatic quadrupole lens group that generates an electrostatic quadrupole field near optical axis AX1. By appropriately adjusting the electrostatic quadrupole field generated by asymmetrical illumination optical system 34, electron beam $EB_1$ having a longitudinal section can be shaped.

Electron beam $EB_1$ is irradiated on an area including a slit-shaped aperture 26a elongated in the X-axis direction formed in the center in the Y-axis direction of primary beam forming plate 26 having a disc-like shape. Electron beam $EB_1$ is shaped into an elongated electron beam $EB_2$ by passing aperture 26a of primary beam forming plate 26, and is imaged on beam forming aperture plate 28 by electromagnetic lens 36A and electromagnetic lens 36B, and then is irradiated on an irradiation area to be described later on extending in the X-axis direction corresponding to an arrangement area of apertures of beam forming aperture plate 28.

Figure 5A:
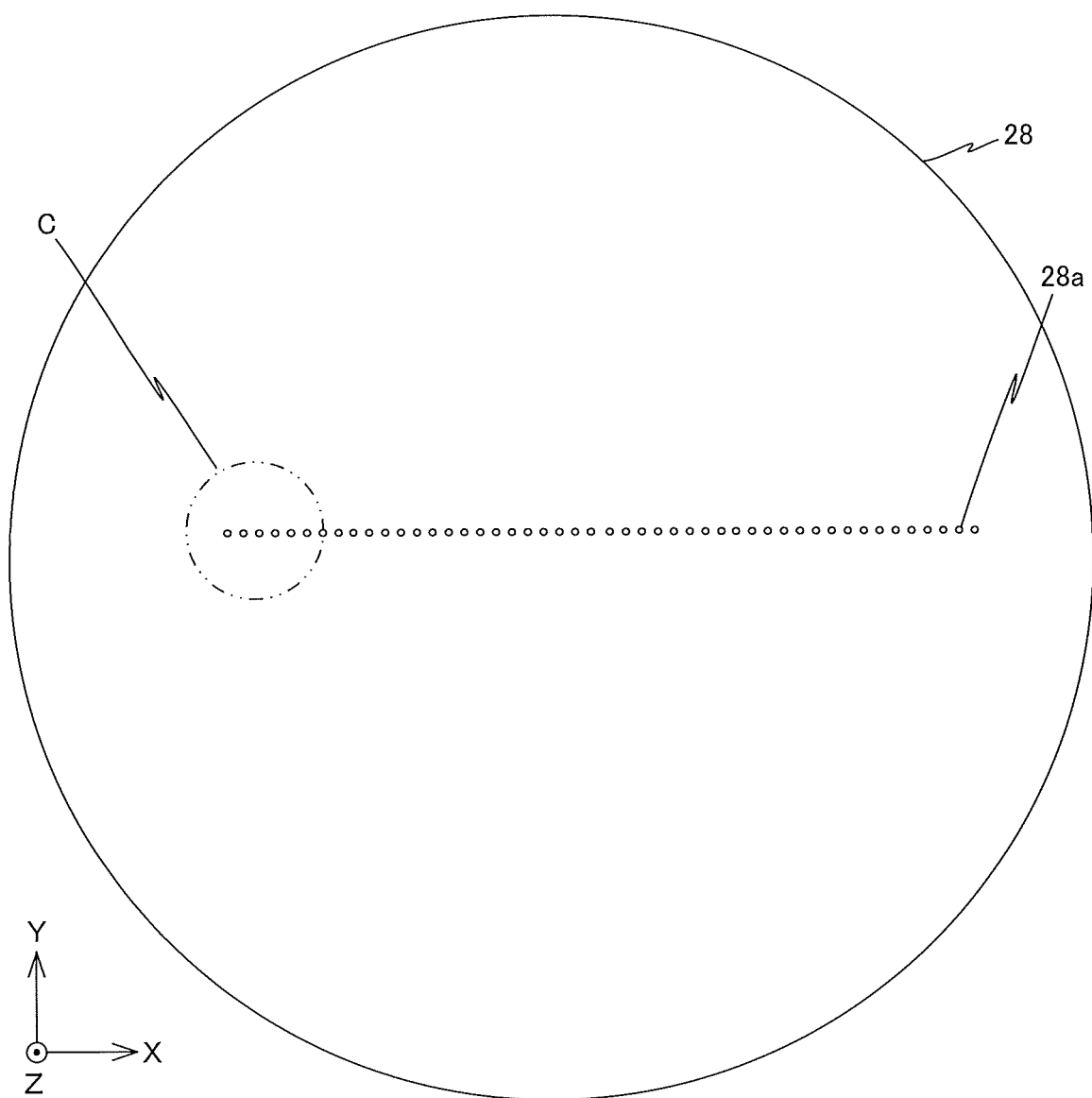
FIG. 5A shows a planar view of a beam forming aperture plate.
Figure 5B:
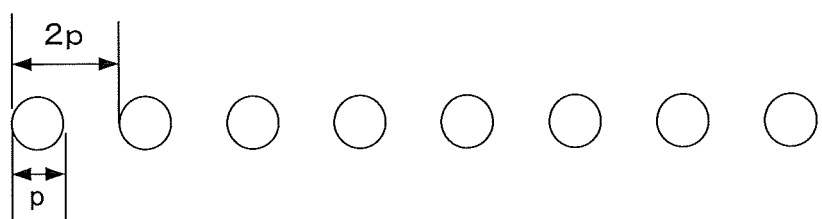
FIG. 5B shows an enlarged view of circle C in FIG. 5A.

In beam forming aperture plate 28, a plurality of apertures is provided at a position corresponding to aperture 26a of primary beam forming plate 26. To describe this in detail, in beam forming aperture plate 28, a plurality of apertures 28a in a row lined in the X-axis direction is formed, as is shown in a planar view in FIG. 5A. Aperture 28a, as is shown in FIG. 5B which is an enlarged view of circle C in FIG. 5A, is arranged in a predetermined pitch $2p$ (several μm (e.g., a range of 1 μm to 4 μm, favorably 2 μm or 3 μm)), in a predetermined number, such as, for example, 5000. Aperture 28a is a circular aperture with a diameter of p.

Referring back to FIG. 4, blanker plate 30 is arranged below beam forming aperture plate 28. In blanker plate 30, an aperture 30a is formed at each part corresponding to the plurality of apertures 28a of beam forming aperture plate 28. Each of apertures 30a is formed larger than aperture 28a, and the electron beam that has passed through aperture 28a can pass through aperture 30a.

On both sides in the Y-axis direction of each of the apertures 30a, a pair of blanking electrodes for deflecting an electron beam $EB_3$ emitted from aperture 30a is provided. Each of the blanking electrodes, although not shown, is connected to a drive circuit via wiring and a terminal. Note that blanking electrodes and wiring are integrally formed, by performing patterning of a conductor film of around several μm to several tens of μm thickness on the main body of blanker plate 30. Blanking electrodes are preferably formed on a surface on the downstream side of the electron beam (of the main body) of blanker plate 30, to prevent damage from occurring due to irradiation of the electron beam.

When voltage is applied to the blanking electrodes, electron beam $EB_3$ having passed aperture 30a is greatly defected. As a consequence, as is shown in FIG. 4, an electron beam $EB_{off}$ bent by the blanking electrodes is guided to the outer side of a circular aperture 32a of final aperture 32 arranged below blanker plate 30, and is blocked by final aperture 32. Aperture 32a is formed near the optical axis of final aperture 32.

Meanwhile, in the case voltage is not applied to the blanking electrodes, electron beam $EB_3$ passes through aperture 32a of final aperture 32. That is, on/off of individual electron beams $EB_3$ can be controlled by applying voltage to the individual blanking electrodes or not. Two each of electromagnetic lenses, that is, a first electromagnetic lens 38A, a second electromagnetic lens 38B, a third electromagnetic lens 38C, and a fourth electromagnetic lens 38D are arranged vertically, with final aperture 32 in between. By the first to fourth electromagnetic lenses 38A to 38D working together, images of multiple apertures 28a of beam forming aperture plate 28 are formed reduced on the surface of wafer W by a predetermined reduction magnification.

Stage feedback deflector 40 arranged below final aperture 32 is structured by an electrostatic deflector that has a pair of electrode plates arranged in the same direction (the X-axis direction) as the row of aperture 28a with optical axis AX1 in between. By this stage feedback deflector 40, the irradiation position of electron beam $EB_3$ can be finely adjusted in the X-axis direction. Note that while stage feedback deflector 40 is structured with the electrostatic deflector in the embodiment, the structure is not limited to this. For example, stage feedback deflector 40 may be structured using a deflector of an electromagnetic type that has at least one pair of coils arranged with the optical axis in between, and deflects a beam by a magnetic field generated when supplying an electric current to the coils.

Each section structuring electron gun 22 and optical system 23 described so far is controlled by a control section 64, based on instructions from main controller 50 (refer to FIG. 11).

Also, a pair of reflected electron detection devices $42_{x1}$ and $42_{x2}$ is provided below the fourth electromagnetic lens 38D, on both sides in the X-axis direction. Also, although it is omitted in FIG. 4, a pair of reflected electron detection devices $42_{y1}$ and $42_{y2}$ is actually provided below the fourth electromagnetic lens 38D, on both sides in the Y-axis direction (refer to FIG. 11). Each of these reflected electron detection devices is structured, for example, by a semiconductor detector, and a reflection component generated from a detection target mark such as an alignment mark or a reference mark on a wafer, a reflected electron in this case, is detected, and a detection signal corresponding to the reflected electron that has been detected is sent to a signal processor 62 (refer to FIG. 11). Signal processor 62 performs signal processing on detection signals of a plurality of reflected electron detection devices 42 that have been amplified by an amplifier (not shown), and sends the processing results to main controller 50 (refer to FIG. 11).

When the multibeam of 5000 of optical system column (multibeam optical system) 20 are all changed to an on state (in a state where the electron beams are irradiated on the wafer), for example, in a rectangular area (exposure area) of 100 μm×20 nm, circular spots of electron beams smaller than the resolution limit of an ultraviolet ray exposure apparatus are formed simultaneously at 5000 points set in positional relations corresponding to the arrangement of 5000 apertures 28a of beam forming aperture plate 28. Each spot has the size of, for example, γ·p=20 nm in diameter. γ is the magnification of optical system column 20.

In the embodiment, an optical system unit 70 is structured by electron gun 22 in column cell 21, optical system 23 and reflected electron detection device 42, and control section 64 and signal processor 62. The number of optical system unit 70 provided is the same as the number of multibeam optical systems (optical system columns) provided (100) (refer to FIG. 11).

100 multibeam optical systems 20, for example, correspond in a ratio of about 1:1 to 100 shot areas formed (or about to be formed according to a shot map), on for example, a 300 mm wafer. In electron beam exposure apparatus 100, each of the 100 multibeam optical systems 20 has circular spots of multiple (n=5000) electron beams of a 20 nm diameter that can each be turned on/off and can be deflected arranged within a rectangular (e.g., 100 μm×20 nm) exposure area. By deflecting and turning on/off the circular spots of the multiple electron beams while scanning wafer W in a predetermined scanning direction (the Y-axis direction) with respect to this exposure area, the 100 shot areas on the wafer are exposed, and patterns are formed. Accordingly, in the case of a 300 mm wafer, moving strokes with some allowance of the wafer on exposure may be several tens of mm, for example, 50 mm will be sufficient.

Figure 6:
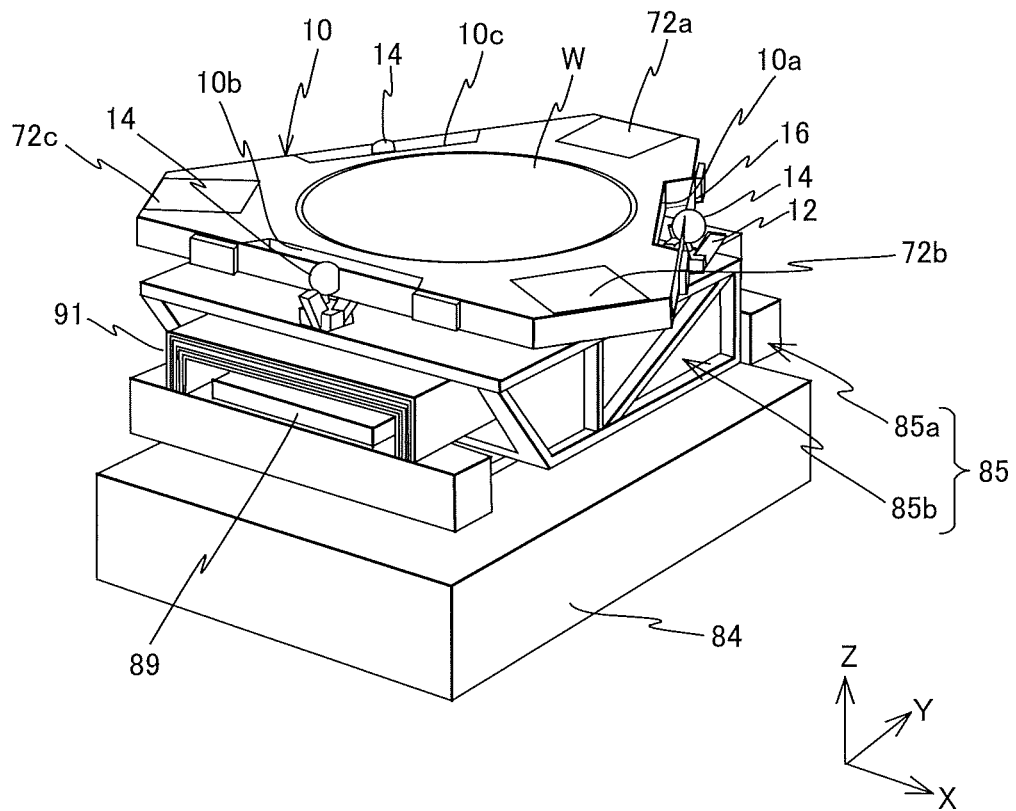
FIG. 6 shows a perspective view of the wafer shuttle attached to the coarse/fine movement stage mounted on a surface plate.
Figure 7:
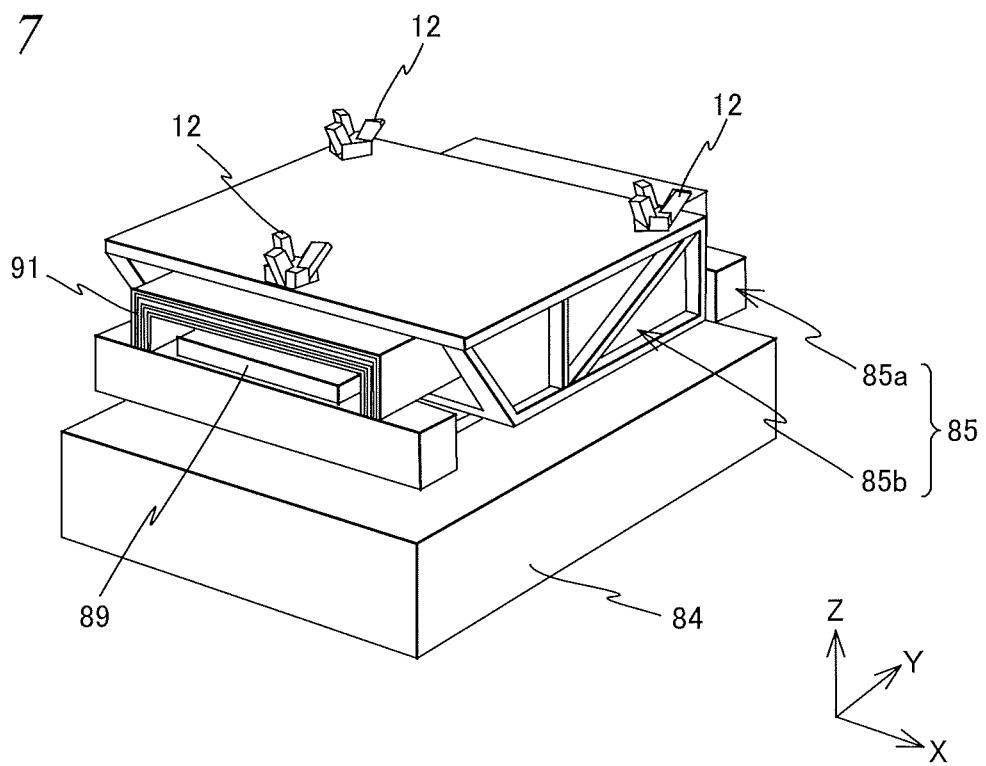
FIG. 7 shows a perspective view of the coarse/fine movement stage in FIG. 6 that has the wafer shuttle detached from a fine movement stage.

Next, structure and the like of stage device 83 will be described. FIG. 6 shows a perspective view of wafer shuttle (hereinafter, shortly referred to as a shuttle) 10 in a state attached to coarse/fine movement stage 85 of stage device 83. FIG. 7 shows a perspective view of coarse/fine movement stage 85 shown in FIG. 6 in a state where shuttle 10 is detached (removed).

Surface plate 84 that stage device 83 is equipped with is actually set on a bottom wall of vacuum chamber 80 that divides exposure chamber 81. Coarse/fine movement stage 85, as is shown in FIGS. 6 and 7, is equipped with a coarse movement stage 85a and a fine movement stage 85b. Coarse movement stage 85a includes a pair of square columnar parts that each extend in the X-axis direction and are arranged spaced apart by a predetermined distance in the Y-axis direction, and can be moved in the X-axis direction in predetermined strokes, for example, 50 mm, on surface plate 84. Fine movement stage 85b can be moved in the Y-axis direction in predetermined strokes with respect to coarse movement stage 85a, such as for example, 50 mm, and can be moved in shorter strokes than in the Y axis direction in the remaining directions of five degrees of freedom, that is, the X-axis direction, the Z-axis direction, rotation direction around the X-axis (the θx direction), rotation direction around the Y-axis (the θy direction), and the rotation direction around the Z-axis (the θz direction). Note that although it is omitted in the drawings, the pair of square columnar parts of coarse movement stage 85a is actually connected and integrated by a connecting member (not shown), in a state where the columnar parts do not interfere with the movement of fine movement stage 85b in the Y-axis direction.

Coarse movement stage 85a is moved (refer to the long arrow in the X-axis direction in FIG. 9) in predetermined strokes (e.g. 50 mm) in the X-axis direction by a coarse movement stage drive system 86 (refer to FIG. 11). Coarse movement stage drive system 86 in the embodiment is structured by a uniaxial drive mechanism that does not cause magnetic flux leakage, such as for example, a feed screw mechanism using a ball screw. Of the pair of square columnar parts of the coarse movement stage, this coarse movement stage drive system 86 is placed in between one of the square columnar parts and surface plate 84. The system is structured, for example, with a screw shaft being attached to surface plate 84 and a ball (a nut) being attached to one of the square columnar parts. Note that the ball may be attached to surface plate 84 and the screw shaft may be attached to one of the square columnar parts.

Also, of the pair of square columnar parts of coarse movement stage 85a, the other square columnar part is structured to move along a guide surface (not shown) provided at surface plate 84.

The screw shaft of the ball screw is rotationally driven by a stepping motor. Or, coarse movement stage drive system 86 may be structured employing a uniaxial drive mechanism equipped with an ultrasonic motor serving as a drive source. In any case, variation of magnetic field caused by magnetic flux leakage does not affect the positioning of the electron beam. Coarse movement stage drive system 86 is controlled by main controller 50 (refer to FIG. 11).

Figure 8:
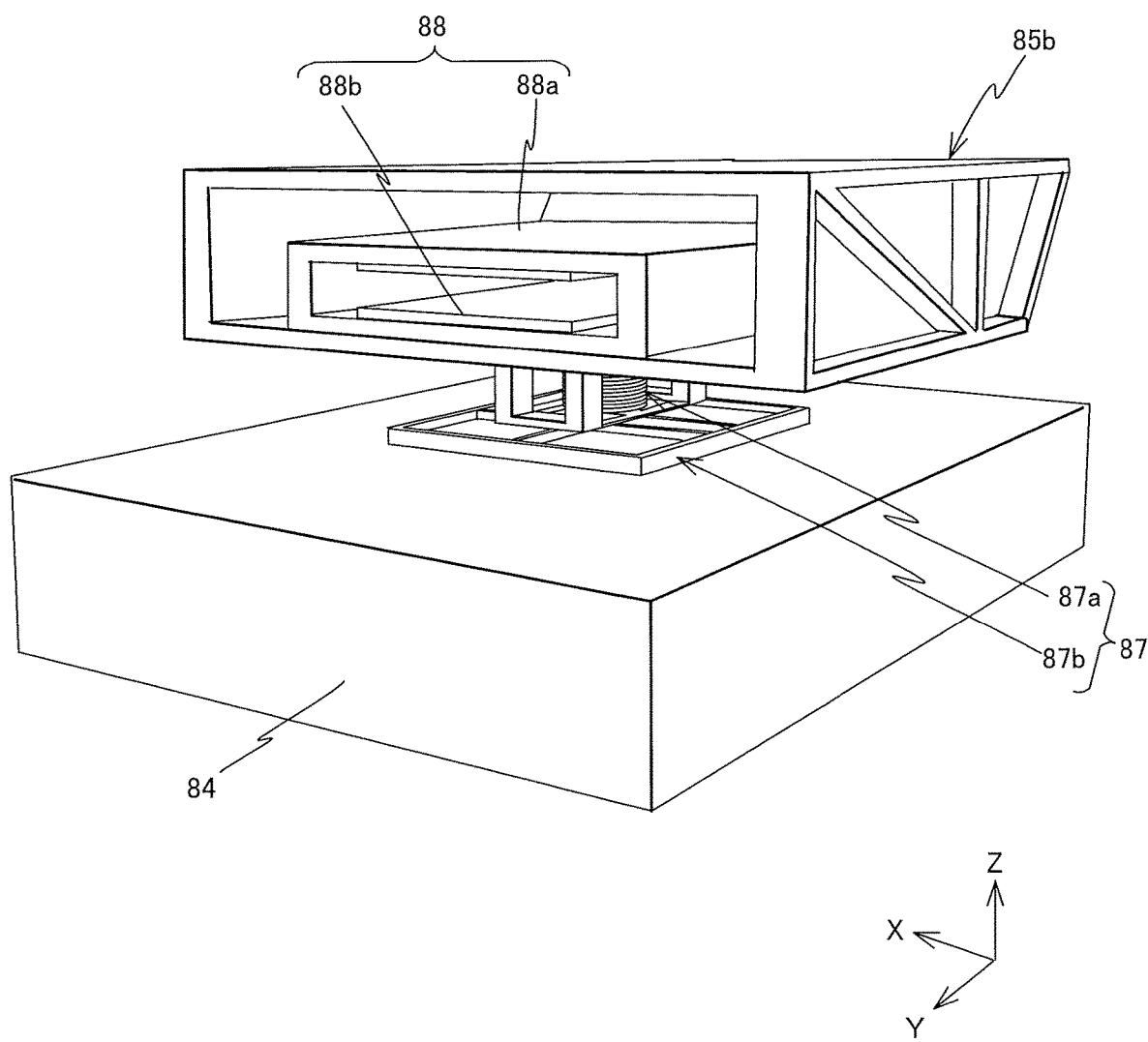
FIG. 8 shows an enlarged view of the fine movement stage mounted on the surface plate.

Fine movement stage 85b, as is shown in a perspective view in FIG. 8, consists of a frame shape member penetrating in the Y-axis direction that has a rectangular shape in the XZ section, and is supported movable within the XY plane on surface plate 84 by a weight canceling device 87. On the outer surface of the side wall of fine movement stage 85*b*, a plurality of ribs is provided for reinforcement.

In the hollow section of fine movement stage 85*b*, a yoke 88*a* extending in the Y-axis direction whose XZ cross-sectional surface is a rectangular frame shape and a pair of magnet units 88*b* fixed to the vertical opposing surfaces of yoke 88*a*, and these yoke 88*a* and the pair of magnet units 88*b* structure a mover 88 of the motor that moves fine movement stage 85*b*.

Figure 9:
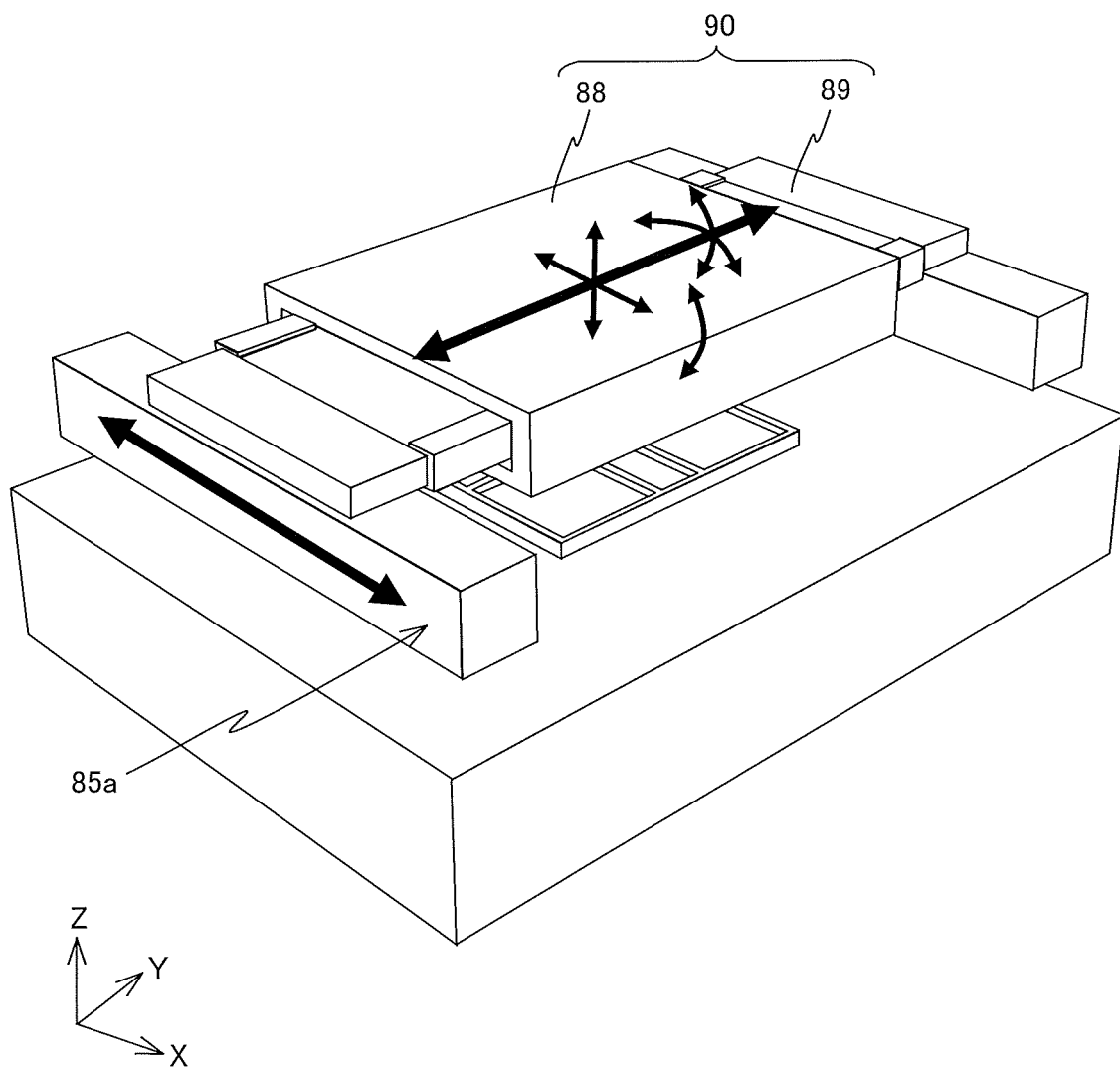
FIG. 9 is a view showing a perspective view of the coarse/fine movement stage in a state where the fine movement stage and a magnetic shield member are removed from the coarse/fine movement stage shown in FIG. 7.

FIG. 9 shows a perspective view of the coarse/fine movement stage in a state where fine movement stage 85*b* and a magnetic shield member to be described later on indicated by code 91 are removed from the state in FIG. 7. As is shown in FIG. 9, corresponding to mover 88, a stator 89 consisting of a coil unit is laid between the pair of square columnar parts of coarse movement stage 85*a*. Stator 89 and mover 88 described earlier structures a motor 90 of a closed magnetic field type and moving magnet type that can move mover 88 with respect to stator 89 as is shown by arrows in each direction in FIG. 9, in the Y-axis direction in predetermined strokes, for example, 50 mm, and can also finely move the mover in the X-axis direction, the Z-axis direction, the θx direction, the θy direction, and the θz direction. In the embodiment, motor 90 structures a fine movement stage drive system that drives the fine movement stage in directions of six degrees of freedom with motor 90. Hereinafter, the fine movement stage drive system will be written as fine movement stage drive system 90, using the same code as the motor. Fine movement stage drive system 90 is controlled by main controller 50 (refer to FIG. 11).

Between the pair of square columnar parts of coarse movement stage 85*a*, as is shown in, for example, FIGS. 6 and 7, magnetic shield member 91 having an inverted U-shape in the XZ section is laid, in a state covering the upper surface and the surfaces on both sides in the X-axis direction of motor 90. That is, magnetic shield member 91 is formed extending in a direction (the Y-axis direction) intersecting the direction in which the square columnar parts extend, and has an upper surface section facing the upper surface of motor 90 in a non-contact manner and side surface sections facing the side surfaces of motor 90 in a non-contact manner. This magnetic shield member 91, in a state inserted into the hollow section of fine movement stage 85*b*, has the lower surface at both ends in the longitudinal direction (the Y-axis direction) of the side surface sections fixed to the upper surface of the pair of square columnar parts of coarse movement stage 85*a*. Also, of the side surface sections of magnetic shield member 91, the section other than the lower surface at both ends described above faces the bottom wall surface (lower surface) of the inner wall surface of fine movement stage 85*b* in a non-contact manner. That is, magnetic shield member 91 is inserted into the hollow section of fine movement stage 85*b* in a state where the member does not interfere with the movement of mover 88 with respect to stator 89.

As magnetic shield member 91, a laminated magnetic shield member is used structured by a multiple layer of films of a magnetic material laminated at a predetermined air-gap (spacing). Other than this, a magnetic shield member with a structure of having films of two types of materials with different magnetic permeability alternately layered may also be used. Magnetic shield member 91 covers the upper surface and the side surfaces of motor 90 over the entire length of the movement strokes of mover 88, and since the member is fixed to coarse movement stage 85*a*, upward (electron beam optical system side) magnetic flux leakage can almost be prevented without fail within the entire moving range of fine movement stage 85*b* and coarse movement stage 85*a*.

Weight canceling device 87, as is shown in FIG. 8, has a metal bellows type air spring (hereinafter shortly referred to as an air spring) 87*a* whose upper end is connected to the lower surface of fine movement stage 85*b*, and a base slider 87*b* consisting of a tabular plate member connected to the upper end of air spring 87*a*. In base slider 87*b*, a bearing section (not shown) is provided that blows out the air inside air spring 87*a* to the upper surface of surface plate 84, and by static pressure (pressure within gap) between a bearing surface of the pressurized air blown out from the bearing section and the upper surface of surface plate 84, self weight of weight canceling device 87, fine movement stage 85*b* and mover 88 (including shuttle 10 and the like in the case shuttle 10 is attached to coarse/fine movement stage 85) is supported. Note that to air spring 87*a*, compressed air is supplied via piping (not shown) connected to fine movement stage 85*b*. Base slider 87*b* is supported on surface plate 84 in a non-contact manner via a kind of differential exhausting type air hydrostatic bearing, and air blown out from the bearing section toward surface plate 84 is kept from leaking out into the periphery (within the exposure chamber).

Here, the structure for attaching shuttle 10 to coarse/fine movement stage 85, or to be more precise, to freely attach/detach shuttle 10 to/from fine movement stage 85*b* will be described.

On the upper surface of fine movement stage 85*b*, as is shown in FIG. 7, three triangular pyramid groove members 12 are provided. These triangular pyramid groove members 12 are provided, for example, at positions that are the three vertices of an almost equilateral triangle in a planar view. To these triangular pyramid groove members 12, spherical bodies or hemispherical bodies provided at shuttle 10 to be described later on can be engaged, and a kinematic coupling is structured along with the spherical bodies or the hemispherical bodies. Note that while FIG. 7 shows triangular pyramid groove members 12 which are like petals structured with three plate members, these triangular pyramid groove members 12 are also referred to as triangular pyramid groove members since they have the same role as the three triangular pyramid grooves that come into point contact with the spherical bodies or the hemispherical bodies. Accordingly, a single member on which the triangular pyramid grooves are formed may also be used, instead of triangular pyramid groove members 12.

In the embodiment, corresponding to the three triangular pyramid groove members 12, as is shown in FIG. 6, three spherical bodies or hemispherical bodies (in the embodiment, balls) 14 are provided at shuttle 10. Shuttle 10 is formed in a hexagonal shape made by cutting off each vertex of an equilateral triangle in a planar view. More specifically, in shuttle 10, cutout sections 10*a*, 10*b*, and 10*c* are formed in the center of each of the three oblique lines in a planar view, and plate springs 16 are attached in a state covering each of the cutout sections 10*a*, 10*b*, and 10*c* from the outside. Ball 14 is fixed to the center in the longitudinal direction of each of the plate springs 16. Each of the balls 14, in the state before being engaged to triangular pyramid groove members 12, moves finely only in a radial direction centering on the center of shuttle 10 (almost coincides with the center of wafer W shown in FIG. 6) when receiving an external force.

After shuttle 10 is moved to a position where each of the three balls 14 almost face the three triangular pyramid groove members 12 above fine movement stage 85*b*, by shuttle 10 being moved downward, each of the three balls 14 is individually engaged with the three triangular pyramid groove members 12, and shuttle 10 is attached to fine movement stage 85b. At the time of this attachment, even if the position of shuttle 10 is shifted from a desired position with respect to fine movement stage 85b, balls 14 receive an external force from triangular pyramid groove members 12 and move in the radial direction as is described earlier when balls 14 engage with triangular pyramid groove members 12. As a consequence, the three balls 14 engage with the corresponding triangular pyramid groove members 12 in the same state at all times. Meanwhile, only by moving shuttle 10 upward and releasing the engagement of balls 14 with triangular pyramid groove members 12, shuttle 10 can be removed (detached) easily from fine movement stage 85b. That is, in the embodiment, the three sets of balls 14 and triangular pyramid groove members 12 structure kinematic coupling, and this kinematic coupling allows the attachment state of shuttle 10 with respect to fine movement stage 85b to be set almost in the same state at all times. Accordingly, no matter how many times shuttle 10 is removed, a constant positional relation between shuttle 10 and fine movement stage 85b can be reproduced only by attaching shuttle 10 to fine movement stage 85b via the kinematic coupling (the three sets of balls 14 and triangular pyramid groove members 12).

On the upper surface of shuttle 10, as is shown in FIG. 6, for example, a circular recess section with a diameter slightly larger than that of wafer W is formed in the center, and an electrostatic chuck (not shown) is provided in the recess section and wafer W is electrostatically suctioned and held by the electrostatic chuck. In this holding state of wafer W, the surface of wafer W is almost flush with the upper surface of shuttle 10.

Next, the position measurement system that measures position information of coarse/fine movement stage 85 will be described. This position measurement system includes a first measurement system 52 that measures position information of shuttle 10 in a state where shuttle 10 is attached to fine movement stage 85b via the kinematic coupling described earlier, and a second measurement system 54 that directly measures position information of fine movement stage 85b (refer to FIG. 11).

First of all, the first measurement system 52 will be described. Grating plates 72a, 72b, and 72c are provided in the vicinity of each of the three sides excluding the three oblique lines described earlier of shuttle 10, respectively, as is shown in FIG. 6. At each of the grating plates 72a, 72b and 72c, a two-dimensional grating is formed whose periodic directions are in a radial direction centering on the center of shuttle 10 (coincides with the center of the circular recess section in the embodiment) and a direction orthogonal to the radial direction. For example, on grating plate 72a, a two-dimensional grating is formed whose periodic directions are in the Y-axis direction and the X-axis direction. Also, on grating plate 72b, a two-dimensional grating is formed whose periodic directions are in a direction (hereinafter referred to as an $\alpha$ direction) forming an angle of −120 degrees with respect to the Y-axis at the center of shuttle 10 and a direction orthogonal thereto, and on grating plate 72c, a two-dimensional grating is formed whose periodic directions are in a direction (hereinafter referred to as a $\beta$ direction) forming an angle of +120 degrees with respect to the Y-axis at the center of shuttle 10 and a direction orthogonal thereto. As the two-dimensional grating, a reflective diffraction grating is used having a pitch of, for example, 1 µm, in each of the periodic directions.

Figure 10A:
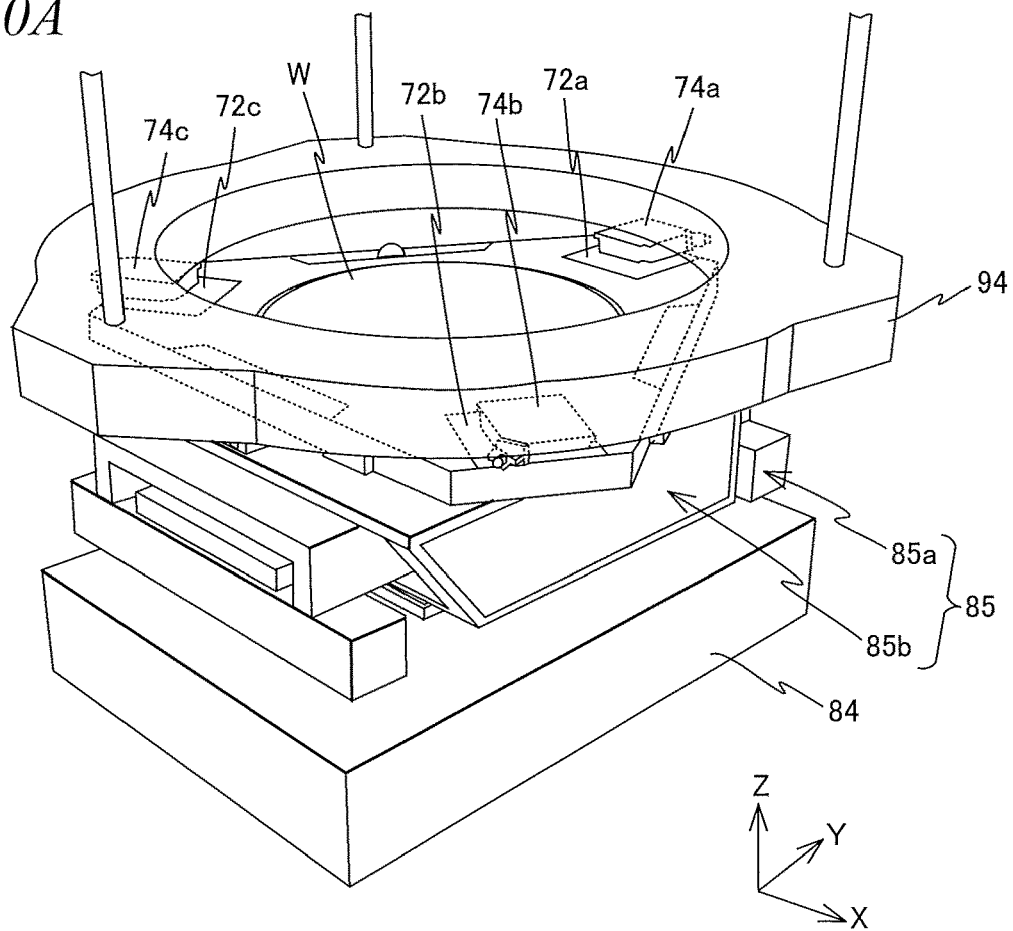
FIGS. 10A and 10B are views (No. 1 and No. 2) used to describe a structure of a first measurement system.
Figure 10B:
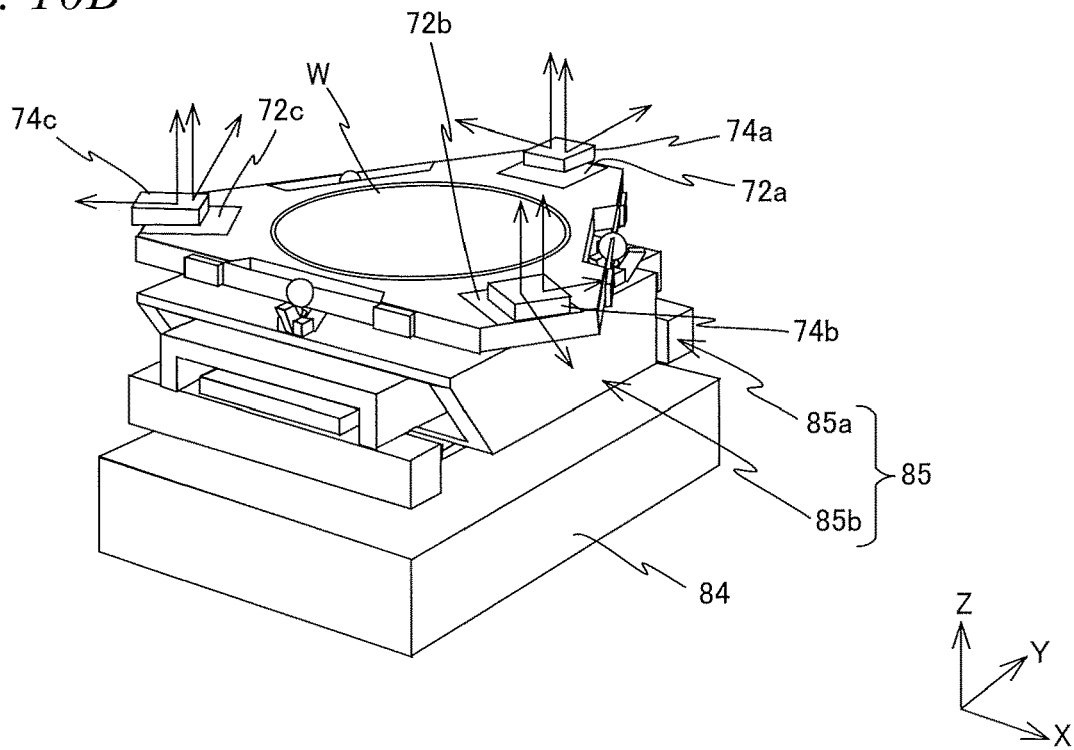

As is shown in FIG. 10A, on the lower surface (the surface on the −Z side) of metrology frame 94, three head sections 74a, 74b, and 74c are fixed at positions that can individually face the three grating plates 72a, 72b, and 72c, respectively. In each of the three head sections 74a, 74b, and 74c, a four-axis encoder head is provided that has measurement axes indicated by four arrows in FIG. 10B.

More specifically, head section 74a includes a first head whose measurement directions are in the X-axis direction and the Z-axis direction and a second head whose measurement directions are in the Y-axis direction and the Z-axis direction that are housed inside the same housing. The first head (to be more precise, an irradiation point on grating plate 72a of a measurement beam that the first head emits) and the second head (to be more precise, an irradiation point on grating plate 72a of a measurement beam that the second head emits) are placed on the same straight line parallel to the X-axis. The first head and the second head of head section 74a structure a two-axis linear encoder that measures positional information of shuttle 10 in the X-axis direction and the Z-axis direction and a two-axis linear encoder that measures positional information of shuttle 10 in the Y-axis direction and the Z-axis direction, each using grating plate 72a.

The remaining head sections 74b and 74c are structured similarly with head section 74a including the first head and the second head, although directions of each of the head sections with respect to metrology frame 94 are different (measurement directions within the XY plane differ). The first head and the second head of head section 74b structure a two-axis linear encoder that measures positional information of shuttle 10 in a direction orthogonal to the $\alpha$ direction within the XY plane and the Z-axis direction and a two-axis linear encoder that measures positional information of shuttle 10 in the $\alpha$ direction and the Z-axis direction, each use grating plate 72b. The first head and the second head of head section 74c structure a two-axis linear encoder that measures positional information of shuttle 10 in a direction orthogonal to the $\beta$ direction within the XY plane and the Z-axis direction and a two-axis linear encoder that measures positional information of shuttle 10 in the $\beta$ direction and the Z-axis direction, each using grating plate 72c.

As each of the first heads and the second heads that head sections 74a, 74b, and 74c each have, an encoder head having a similar structure as the displacement measurement sensor head disclosed in, for example, U.S. Pat. No. 7,561,280 can be used.

The three sets, or the total of six two-axis encoders described above, that is, the three head sections 74a, 74b, and 74c that measure position information of shuttle 10 using the three grating plates 72a, 72b, and 72c, respectively, structure an encoder system, and this encoder system structures the first measurement system 52 (refer to FIG. 11). Position information measured by the first measurement system 52 is supplied to main controller 50.

With the first measurement system 52, since each of the three head sections 74a, 74b, and 74c has four degrees of freedom on measurement (measurement axes), measurement can be performed in a total of 12 degrees of freedom. That is, since the degrees of freedom in a three-dimensional space are six at most, redundant measurement is actually performed and two each of position information can be obtained for each of the directions of six degrees of freedom.

Accordingly, based on position information measured by the first measurement system 50, main controller 50 uses average values of two each of the position information for each of the degrees of freedom as measurement results for each direction. This allows position information of shuttle 10 and fine movement stage 85b to be obtained with high precision for all directions of six degrees of freedom by the averaging effect.

Next, the second measurement system 54 will be described. The second measurement system 54 can perform measurement of position information of fine movement stage 85 in directions of six degrees of freedom, regardless of whether or not shuttle 10 is attached to fine movement stage 85b. The second measurement system 54 can be structured, for example, by an interferometer system that irradiates a beam on a reflection surface provided on the outer surface of the side wall of fine movement stage 85b and measures position information of fine movement stage 85 in directions of six degrees of freedom by receiving the reflection light. Each interferometer of the interferometer system may be supported by suspension via a support member (not shown), or may be fixed to surface plate 84. Since the second measurement system 54 is provided within exposure chamber 81 (within vacuum space), there is no risk of the measurement accuracy decreasing due to air fluctuation. Also, since the second measurement system 54 is used in the embodiment mainly to maintain position and attitude of fine movement stage 85b in a desired state when shuttle 10 is not attached to fine movement stage 85b, that is, when exposure of the wafer is not performed, the measurement accuracy may be lower than that of the first measurement system 52. Position information measured by the second measurement system 54 is supplied to main controller 50 (refer to FIG. 11). Note that the structure of the second measurement system is not limited to the interferometer system, but also may be structured by an encoder system or by a combination of the encoder system and the interferometer system. In the latter case, position information in directions of three degrees of freedom of fine movement stage 85b within the XY plane may be measured by the encoder system, and the remaining position information in directions of three degrees of freedom may be measured by the interferometer system.

Measurement information according to the first measurement system 52 and the second measurement system 54 is sent to main controller 50 and main controller 50 controls coarse/fine movement stage 85, based on the measurement information according to the first measurement system 52 and/or the second measurement system 54. Also, main controller 50 uses the measurement information by the first measurement system 52 to control stage feedback deflector 40 of each of the plurality of multibeam optical systems 20 that electron beam irradiation device 92 of exposure system 82 has.

FIG. 11 shows a block diagram of an input/output relation of main controller 50 which mainly structures the control system of electron beam exposure apparatus 100. Main controller 50 includes a microcomputer and the like, and has overall control over each part that structures electron beam exposure apparatus 100 including each part shown in FIG. 11.

Next, a principle of correcting distortion of each multibeam optical system (optical system column) 20 structuring the electron beam optical system performed in electron beam exposure apparatus 100 according to the embodiment will be described, based on FIGS. 12A to 13B. Here, in beam forming aperture plate 28 of multibeam optical system 20, a plurality of (e.g., 5000) apertures 28a is formed on a straight line parallel to the X-axis (refer to FIG. 5A). Also, in multibeam optical system 20, images of the plurality of apertures 28a are formed on the image plane in a straight line parallel to the X-axis, that is, the irradiation positions of the beams that have each passed through the plurality of apertures 28a are designed to be arranged in a straight line parallel to the X axis on the irradiation surface. However, the irradiation position (image forming position of the image of each aperture 28) on the irradiation surface of the beams having passed through each of the plurality of (e.g., 5000) apertures 28a of beam forming aperture plate 28 and are irradiated on the image plane is actually shifted by a Coulomb force (Coulomb interaction) acting between other beams. This shift of forming position of the image differs according to the on/off state of the beam that passes through each of the plurality of apertures 28a. Since the phenomenon described above in which a shift occurs in the forming position of the image is similar to the phenomenon in which a pattern image via a lens is distorted due to distortion aberration of the lens, in the embodiment, the shift of the forming position of the image described above is referred to as distortion of each multibeam optical system (optical system column) 20, or distortion of aperture image.

Figure 12A:
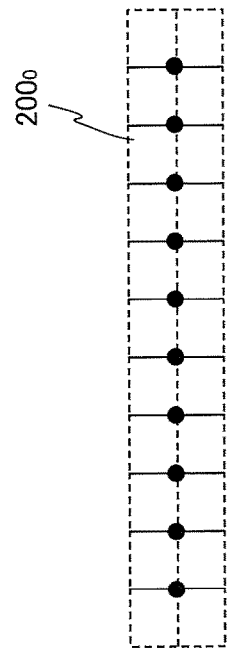
FIGS. 12A and 12B are views used to describe a principle of correcting distortion of the multibeam optical system (optical system column).
Figure 12A:
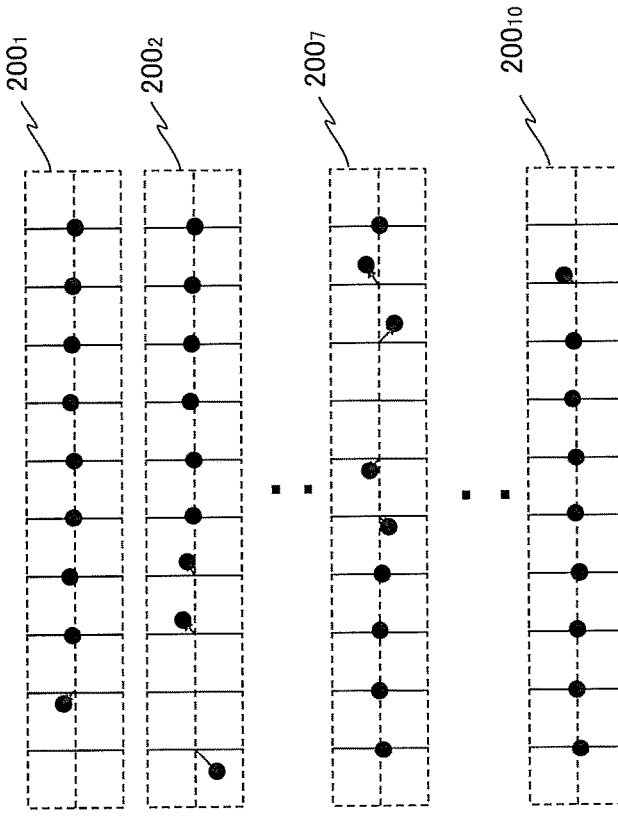

Here, to simplify the description, as is shown in FIG. 12A, the description will be made using an aperture member 29 that has 10 apertures $29a_1$ to $29a_{10}$ formed on the same straight line in the X-axis direction at an equal spacing. Aperture member 29 is equivalent to an integrated object of beam forming aperture plate 28 and blanker plate 30 described earlier. In this case, aperture $29a_i$ (i=1 to 10) shown in a white color shows an aperture through which a beam that will shift to the on state passes (aperture 28a (and aperture 30a) through which a beam irradiated on a target surface via aperture 32a passes since voltage is not to be applied to the corresponding blanking electrode), and aperture $29a_i$ shown in a black color shows an aperture through which a beam that will shift to an off state passes (aperture 28a (and aperture 30a) through which the beam that passes is to be blocked by final aperture 32 since voltage is to be applied to the corresponding blanking electrode).

Figure 12B:
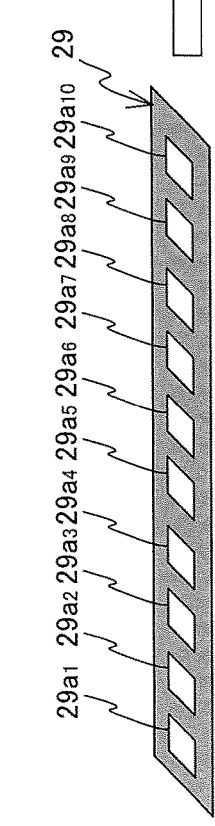
Figure 12B:
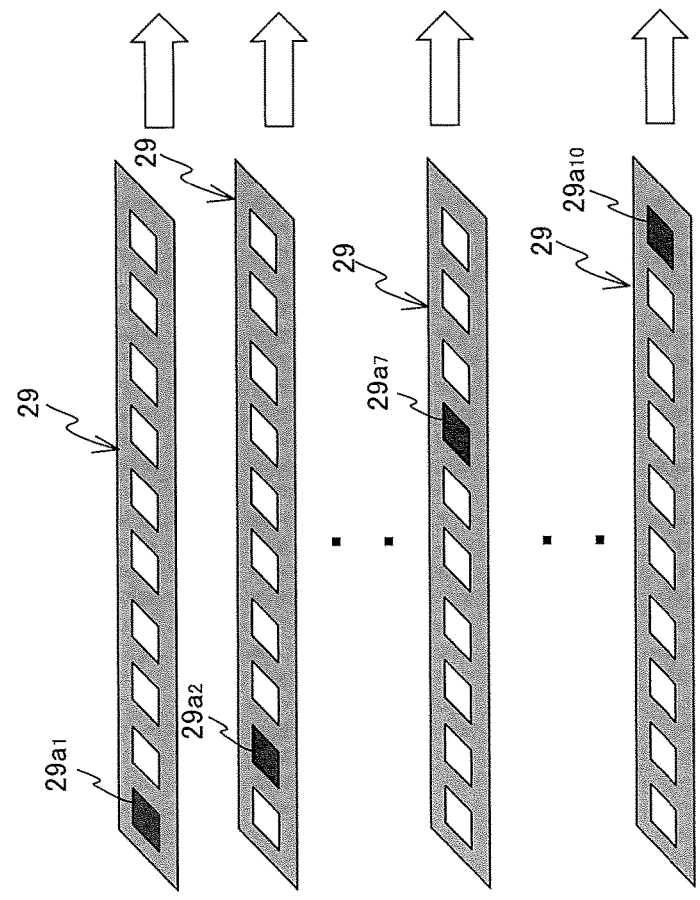

In FIGS. 12A and 12B, the left side shows the on/off state of the beams passing through each aperture $29a_i$ using colors (white or black) of each aperture $29a_i$ of aperture member 29, and the right side shows corresponding distortion tables 200 with outlined arrows in between. In each distortion table 200, the black circles show the irradiation position of the beams (that is, the image forming position of apertures 28a).

Multibeam optical system (optical system column) 20 is to be manufactured according to a design value, so that distortion does not occur (shift in irradiation position does not occur in the plurality of beams) in the plurality of aperture images as is shown in distortion table $200_0$ at the right side of FIG. 12A when all the beams passing through each of the apertures $29a_1$ to $29a_{10}$ are in the on state like aperture member 29 shown on the left side of FIG. 12A. Each of the beams passing through each of the apertures $29a_1$ to $29a_{10}$ receives Coulomb force (Coulomb interaction) acting between other beams, and as a consequence, all the beams are to be irradiated in a straight line at an equal spacing, as is shown in distortion table $200_0$. Note that while irradiation position shift may actually occur in a plurality of beams when each of the beams passing through all the apertures $29a_1$ to $29a_{10}$ of the beam forming aperture plate is in the on state, positional relation of the plurality of apertures 28a of beam forming aperture plate 28 is to be adjusted at the manufacturing stage so that even in such a case, positional relation of the irradiation position of the plurality of beams becomes a desired relation (e.g., to be arranged on a straight line parallel to the X-axis at an equal spacing).

However, when any one of the beams shifts to the off state, Coulomb force interacting between the beams changes and the irradiation position of other beams changes (the irradiation position shifts). The way of shifting of the irradiation position changes depending on which beam moves to the off state. Accordingly, the irradiation state of the plurality of beams passing through each of the plurality of apertures $29a_i$, in this case, distortion tables of a plurality of aperture images (hereinafter referred to shortly as distortion tables) $200_1$ to $200_{10}$ as is shown in FIG. 12B, including information concerning change of irradiation position of the plurality of beams that occur when the on/off state changes for each aperture $29a_i$, can be used without any changes as a correction table for distortion of the aperture images.

Distortion of the aperture image that occurs when only the beam passing through one of the plurality of apertures $29a_i$, such as for example, the first aperture $29a_i$ from the left as in aperture member 29 shown at the top of FIG. 12B, is changed to an off state, is acquired by simulation or experiment (e.g., actual exposure). As a consequence, distortion table $200_1$ shown on the right side is to be obtained.

Similarly, distortion (irradiation position shift of multiple beams) of the aperture image that occurs when only the beam that passes through one of the plurality of apertures $29a_i$, such as for example, the $i^{th}$ (i=2 to 10) aperture $29a_i$ from the left, as in aperture member 29 shown second from the top and under in FIG. 12B, is changed to an off state is acquired by simulation or experiment (e.g., actual exposure). As a consequence, distortion tables $200_2$ to $200_{10}$ shown on the right side are to be obtained.

In this case, in the actual exposure, while the beam which is to be in the off state changes freely each moment according to a target pattern, it is considered that distortion of the aperture image obtained from overlaying information (information concerning change of irradiation position of the plurality of beams that occurs when the on/off state changes for each aperture) included in each of the distortion tables $200_1$ to $200_{10}$ when only the beam that passes through the $i^{th}$ aperture $29a_i$ from the left described above is changed to an off state is actually generated.

For example, in the case the first, the second, the seventh, and the tenth beams from the left are turned off and the other beams are on, distortion information of the aperture image in this case, that is, correction information of distortion is obtained from overlaying information included in each of the four distortion tables $200_1$, $200_2$, $200_7$, and $200_{10}$ shown in FIG. 12B.

For example, in the case a first beam in the on state passing through a specific aperture $29a_i$ is shifted by $\Delta x_1$ in the X-axis direction and by $\Delta y_1$ in the Y-axis direction under a first condition (a condition in which only a second beam different from the first beam turns to the off state), and is shifted by $\Delta x_2$ in the X-axis direction and by $\Delta y_2$ in the Y-axis direction under a second condition (a condition in which only a third beam different from the first beam and the second beam turns to the off state), it is considered that under a third condition, which is a combination of the first condition and the second condition, position of the first beam shifts only by $\Delta y_3=(\Delta y_1+\Delta y_2)$ in the Y-axis direction, and shifts only by $\Delta x_3=(\Delta x_1+\Delta x_2)$ in the X-axis direction. For example, in the case the first beam undergoes only a $(\Delta x, \Delta y)$ position shift on an XY orthogonal coordinate system under the first condition and undergoes only a $(-\Delta x, -\Delta y)$ position shift on the XY orthogonal coordinate system under the second condition, then under the third condition, the first beam undergoes only a $\Delta y_3=\{\Delta y+(-\Delta y)\}=0$ position shift in the Y-axis direction and only a $\Delta x_3=\{\Delta x+(-\Delta x)\}=0$ position shift in the X-axis direction, that is, it is considered that position shift does not occur on the XY coordinate system.

According to such overlay method, for each of them (100) multibeam optical systems 20, for n (5000) apertures $28a$ of beam forming aperture plate 28, distortion table $200_1$ to $200_n$ under the condition of only the beam passing through one aperture of the first to $n^{th}$ apertures being in the off state is to be obtained in advance by simulation or by experiment for the corresponding n in different conditions, and is to be stored in a storage device within main controller 50.

Then, for example, in actual complementary lithography, on forming a cut pattern with respect to a line-and-space pattern whose periodic direction is in the X-axis direction formed on wafer W using multiple beams (electron beams) emitted from each of the multibeam optical systems 20, irradiation timing (on/off) of each beam is controlled, based on distortion of aperture images (distortion of multibeam optical system 20) obtained from overlay of information included in the distortion table corresponding to the beam switched to the off state of distortion tables $200_1$ to $200_n$ of n (=5000), that is, correction information of distortion, while scanning wafer W (fine movement stage 85b) in the Y-axis direction.

Figure 13A:
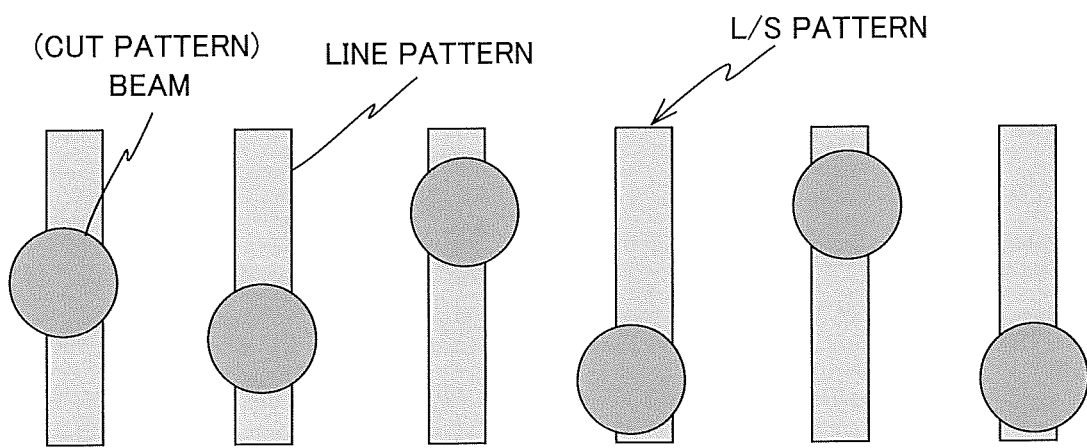
FIGS. 13A and 13B are views used to describe an effect of correcting distortion of the multibeam optical system (optical system column).
Figure 13B:
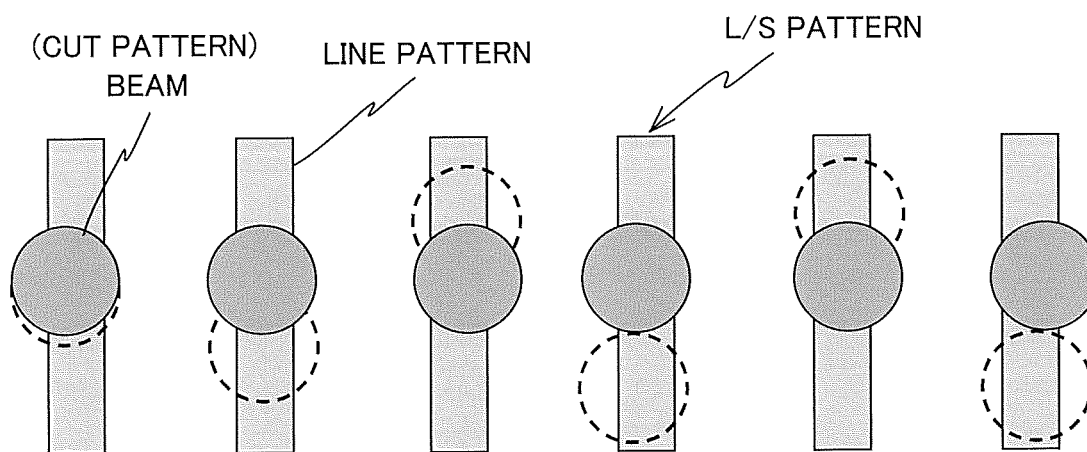

With this control, in the case distortion is not corrected, even when irradiation position of each beam on (the line pattern of) the L/S pattern is shifted in the Y-axis direction as is conceptually shown in FIG. 13A, by performing the irradiation timing (on/off) control described above on each beam, the cut pattern can be formed (the beam can be irradiated) at a desired position on the line pattern without being affected by distortion described earlier as is conceptually shown in FIG. 13B. Also, position shift in the X-axis direction from the design irradiation position of the beams is reduced by controlling (adjustment by changing the voltage applied to the electrodes) stage feedback deflector 40. Here, under a condition in which there are a plurality of beams that are to be in the on state, stage feedback deflector 40 is to be controlled so that position shift in the X-axis direction is averaged overall for the plurality of beams that are to be in the on state. Or, since requirements for the X-axis direction (periodic direction of the line-and-space pattern subject to cutting of a line pattern in complementary lithography) is looser than that of the Y-axis direction (scanning direction), irradiation position shift does not necessarily have to be corrected.

Following is a flow on processing with respect to the wafer in the embodiment.

First of all, a wafer before exposure on which an electron beam resist is coated (to be written as wafer $W_1$ for convenience) is mounted on a shuttle (written as shuttle $10_1$ for convenience) in a measurement chamber (not shown), and is suctioned by electrostatic chucking of shuttle $10_1$. Then, to wafer $W_1$, pre-measurement such as approximate (rough) position measurement of shuttle $10_1$ and flatness measurement is performed with the measurement system (not shown) in the measurement chamber.

Next, shuttle $10_1$ holding wafer $W_1$ is carried into exposure chamber 81 via a load lock chamber provided in chamber 80, for example, by a carrier system (not shown), and by a carrier system (not shown) inside exposure chamber 81, is carried to a predetermined first waiting position (e.g., a shelf of a plurality of housing shelves of a shuttle stocker (not shown)).

Next, in exposure chamber 81, a shuttle exchange operation, that is, a wafer exchange operation integrally with the shuttle is to be performed in the manner described below.

When exposure of a wafer (to be written as wafer $W_0$ for convenience) on which exposure is being performed at the time of carry-in of shuttle $10_1$ is completed, a shuttle (written as shuttle $10_0$ for convenience) holding wafer $W_0$ that has been exposed is detached from fine movement stage 85b, and is carried to a predetermined second waiting position by the carrier system. The second waiting position is to be another shelf of the plurality of housing shelves of the shuttle stocker described earlier.

Note that prior to shuttle $10_0$ being detached from fine movement stage 85b, feedback control of position and attitude of fine movement stage 85b in directions of six degrees of freedom based on measurement information of the second measurement system 54 (refer to FIG. 11) is started by main controller 50, and then until position control of fine movement stage 85b integral with shuttle $10_1$ based on measurement information of the first measurement system 52 (refer to FIG. 11) is started, the position and attitude of fine movement stage 85b in directions of six degrees of freedom are maintained to a predetermined reference state.

Next, by the carrier system in exposure chamber 81, shuttle $10_1$ is carried upward toward an area above coarse/fine movement stage 85, and is attached to fine movement stage 85b. On this operation, as is described earlier, since the position and attitude of fine movement stage 85b in directions of six degrees of freedom are maintained to the predetermined reference state, only by attaching shuttle $10_1$ to fine movement stage 85b via kinematic coupling, the positional relation between electron beam irradiation device (electron beam optical system) and shuttle $10_1$ becomes a desired positional relation. Then, by finely adjusting the position of fine movement stage 85b while taking into consideration the approximate position measurement with respect to shuttle 10 of wafer $W_1$ performed in advance in the measurement chamber, that is, results of measuring the relative position information between shuttle 10 (reference mark) and wafer $W_1$, it becomes possible to irradiate the electron beam from the electron beam optical system without fail on at least one each of alignment marks formed on scribe lines (street lines) corresponding to each of the 100 shot areas formed on wafer $W_1$ on shuttle $10_1$ attached to fine movement stage 85b. Accordingly, reflected electrons from at least one each of alignment marks are detected with at least one of reflected electron detection devices $42_{x1}$, $42_{x2}$, $42_{y1}$, and $42_{y2}$ and full-shot alignment measurement of wafer $W_1$ is performed, and based on the results of this full-shot alignment measurement, exposure using electron beam irradiation device 92 is started with respect to the plurality of shot areas on wafer $W_1$.

Concurrently with the full-shot alignment measurement and exposure described above, shuttle $10_0$ located at the second waiting position is carried out from exposure chamber 81 and to the measurement chamber described earlier. A detailed description thereabout will be omitted.

In exposure chamber 81, while exposure on wafer W1 is being performed, shuttle 10 holding the wafer subject to the next exposure that has completed pre-measurement is carried into the exposure chamber, and is to wait at the first waiting position described earlier. Then, when exposure to wafer $W_1$ is completed, the wafer exchange operation integrally with the shuttle described earlier is performed, and hereinafter, the processing similar to the one described above is repeatedly performed.

As is obvious from the description so far, in the embodiment, by shuttle 10 holding wafer W, coarse/fine movement stage 85 to which shuttle 10 is attached, and fine movement stage drive system 90 and coarse movement stage drive system 86, a stage that moves holding wafer W serving as a target is structured.

As is described so far, with electron beam exposure apparatus 100 according to the embodiment, at the time of actual exposure of the wafer, main controller 50 controls the scanning (movement) in the Y-axis direction of fine movement stage 85b to which shuttle 10 holding the wafer is attached with respect to electron beam irradiation device 92, via fine movement stage drive system 90 and coarse movement stage drive system 86. Concurrently with this, main controller 50 adjusts the irradiation position of the plurality of beams for each of m (e.g., 100) optical system columns (multibeam optical systems) 20, based on distortion tables (correction tables) $200_1$ to $200_n$ of the same number as aperture 28a (or the plurality of beams) including information concerning the change of irradiation position of the plurality of beams that occurs when the irradiation state (on state and off state) of n beams each having passed through n (e.g., 5000) apertures 28a of beam forming aperture plate 28 is changed for each aperture 28a. Especially the irradiation position of the plurality of beams in the Y-axis direction is adjusted by individually controlling the irradiation timing of the plurality of beams irradiated on the wafer from each of the 100 multibeam optical systems 20. This allows a cut pattern to be formed at a desired position (refer to FIG. 13B), for example, with respect to a fine line and space pattern whose periodic direction is in the X-axis direction formed in advance in each of, for example, the 100 shot areas on the wafer by double patterning and the like using an ArF liquid immersion exposure apparatus, which makes exposure of high precision and high throughput possible.

Note that in the embodiment above, the case has been described where correction information of distortion in table data format, that is, the distortion table described earlier, is prepared only by the number (n) of apertures 28a of beam forming aperture plate 28, and at the time of actual exposure, correction information of distortion (distortion of aperture image) of multibeam optical systems 20 is calculated by overlaying the information included in the distortion table corresponding to the beams in the off state according to the on/off of the beams. However, the distortion tables are not limited to the table of only one beam in the off state, and the distortion tables prepared may be a combination of distortion tables in which a plurality of beams are turned off simultaneously, and have different combinations of the beams that are to be turned off. In such a case, correction information of distortion (distortion of aperture image) of multibeam optical system 20 may be calculated by selecting the combination of distortion tables according to the on/off state of the beams to be set at the time of actual exposure from the plurality of distortion tables prepared, and by overlaying the information included in the selected distortion tables. Or, influence of the individual beams may be calculated by solving simultaneous equations corresponding to the combination of the selected plurality of distortion tables. Even in this manner, correction information of distortion (distortion of aperture image) of multibeam optical system 20 according to the on/off state of the beams can be calculated at the time of actual exposure.

Also, instead of the distortion table in the table data format, correction information of distortion may also be expressed as a function. For example, when shift in the Y-axis direction of the irradiation position of the beam passing through the $i^{th}$ aperture brought about by a beam of a unit current passing through a $j^{th}$ aperture is $\Delta Y(i,j)$, and the current amount of the beam passing through the $j^{th}$ aperture is I(j), then when the total sum of {ΔY(i,j)·I(j)} is taken from j=1 to the total number of formed beams (e.g., 5000), the total irradiation position shift in the Y-axis direction of the beams passing through the $i^{th}$ aperture can be expressed. Furthermore, not only a simple linear combination, but also a component proportional to the square of I(j) or a crossing component of current amount I(j) of the $j^{th}$ beam and current amount I(k) of a $k^{th}$ beam may also be considered. As a matter of course, the total irradiation position shift in the X-axis direction of the beams passing through the $i^{th}$ aperture may be obtained in a manner similar to the description above.

At the time of actual exposure, for each of the beams that are to be in the on state, the total irradiation position shift in the Y-axis direction (and the X-axis direction) should be obtained in the manner described above, the irradiation timing of each beam should be adjusted at the time of scanning exposure to correct the irradiation position shift, and stage feedback deflector 40 should be controlled as necessary.

Also, in the embodiment described above, as the irradiation state of each beam of the multibeam optical system, while the on state and the off state were given as an example on the premise that the irradiation current amount of the beam is constant, the embodiment is not limited to this, and the irradiation current amount of the beam may be included as the irradiation state of each beam of the multibeam optical system. That is, for the plurality of beams, since the Coulomb force (Coulomb interaction) acting among the plurality of beams differs if the irradiation current amount is different even if the on/off state is the same, the distortion table described earlier may be prepared according to the irradiation current amount. As a matter of course, not only the distortion table but also information of distortion expressed as a function may be prepared as correction information for different irradiation current amounts.

As a method of changing the irradiation current amount of each beam, for example, an electrostatic lens can be provided on the electron gun 22 side of each aperture 28a of beam forming aperture plate 28. In such a case, it becomes possible to increase/decrease the irradiation current amount that passes through aperture 28a by increasing/decreasing the converging action of each of the electrostatic lenses according to the magnitude of voltage applied the electrostatic lenses. That is, when the voltage is not applied to the electrostatic lenses, electrons that pass through the center of the electrostatic lenses and the electrons that pass through areas other than the center of the electrostatic lenses proceed in a straightforward manner. Meanwhile, when the voltage is applied to the electrostatic lenses, electrons that pass through the center of the electrostatic lenses proceed in a straightforward manner, however, the proceeding direction of the electrons that pass through areas other than the center of the electrostatic lenses are changed by the action of the electrostatic lenses. This allows the number of electrons passing through apertures 28a, or the irradiation current amount, to be adjusted.

Also, in the embodiment described above, while the case has been described in which scanning exposure of wafer W with the electron beams is performed while fine movement stage 85b that holds wafer W via shuttle 10 moves in the scanning direction (the Y-axis direction) with respect to electron beam irradiation device 92 (electron beam optical system), in the case a structure is employed in which electron beam irradiation device 92 (electron beam optical system) can move in a predetermined direction such as the Y-axis direction, scanning exposure of wafer W with the electron beams may be performed while moving the electron beam irradiation device (electron beam optical system) in the Y-axis direction in a state where wafer W is stationary. Or, scanning exposure of wafer W with the electron beams may be performed while wafer W and the electron beam irradiation device are moved in directions opposite to each other.

In short, main controller 50 should control relative movement between fine movement stage 85b and electron beam optical system (a multi-column optical system that includes a plurality of multibeam optical systems 20), and for each multibeam optical system 20, should adjust the irradiation position of the plurality of beams with respect to wafer W, based on information concerning change in the irradiation position of another beam (the second beam) occurring based on the irradiation state described earlier of at least one beam (the first beam) of the plurality of beams.

Note that in the embodiment described above, while the case has been described where beam forming aperture plate 28 on which n (5000) apertures 28a are formed arranged in a line within a strip-shaped area of a predetermined width in the X-axis direction is used, instead of this beam forming aperture plate 28, a beam forming aperture plate may be used in which two rows of apertures consisting of apertures of a predetermined number lined in the X-axis direction are arranged shifted in the X-axis direction so that the apertures do not overlap in the Y-axis direction. Also, the plurality of apertures on the beam forming aperture plate does not necessarily have to be arranged in a strip-shaped area. However, mutual positions are preferably shifted in the X-axis direction so that the apertures do not overlap in the Y-axis direction.

Also, in the embodiment described above, while the case has been described where the electron beam optical system that electron beam irradiation device 92 is equipped with is structured by m optical system columns 20 consisting of multibeam optical systems, the embodiment is not limited to this, and the electron beam optical system may also be a single column type multibeam optical system.

Also, in the embodiment described above, while the case has been described of a type of electron beam exposure apparatus in which wafer W is carried in a state held by shuttle 10, the embodiment is not limited to this, and the exposure apparatus may be a normal type of electron beam exposure apparatus in which wafer W is carried onto a stage (or a table) separately for exposure, and while the stage (or table) holding the wafer is moved in the scanning direction, exposure is performed irradiating wafer W with a beam from an electron beam irradiation device (electron beam optical system). Even in such an electron beam exposure apparatus, as long as the apparatus is equipped with an electron beam optical system consisting of a multibeam optical system, the correction method described earlier of distortion (irradiation position shift of each beam on the irradiation surface) of the multiple aperture images of the beam forming aperture plate formed on the image plane of the multibeam optical system can be suitably applied.

Also, in the embodiment described above, while the case has been described in which fine movement stage 85b can move in directions of six degrees of freedom with respect to coarse movement stage 85a, the embodiment is not limited to this, and the fine movement stage may be movable only within the XY plane. In this case, the first measurement system 52 and the second measurement system 54 the measure position information of the fine movement stage can also measure position information in directions of three degrees of freedom within the XY plane.

Note that in the embodiment described above, while the case has been described where the first measurement system 52 is structured by an encoder system, the embodiment is not limited to this, and the first measurement system 52 may also be structured by an interferometer system.

Note that in the embodiment described above, while electron beam irradiation device 92 is supported by suspension integral with metrology frame 94 from the top plate (ceiling wall) of the vacuum chamber, via three suspension support mechanisms 95*a*, 95*b*, and 95*c*, the embodiment is not limited to this, and electron beam irradiation device 92 may also be supported by a body placed on the floor. Also, in the embodiment described above, while the case has been described where exposure system 82 is entirely housed inside vacuum chamber 80, however, the embodiment is not limited to this, and of exposure system 82, the part excluding the lower end of barrel 93 of electron beam irradiation device 92 may be exposed outside of vacuum chamber 80.

Note that in the embodiment described above, while the case has been described where the target is a wafer for manufacturing semiconductor devices, electron beam exposure apparatus 100 according to the embodiment may also be suitably applied on forming a fine pattern on a glass substrate and manufacturing a mask. Also, in the embodiment described above, while the electron beam exposure apparatus using the electron beam as the charged particle beam is described, the embodiment described above can also be suitably applied to an exposure apparatus that uses an ion beam and the like as the charged particle beam for exposure.

Also, the exposure techniques that structure complementary lithography are not limited to the combination of the liquid immersion exposure technique using the ArF light source and the charged particle beam exposure technique, and for example, the line-and-space pattern may be formed with a dry exposure technique using the ArF light source, or other light sources such as the KrF light source.

Figure 14:
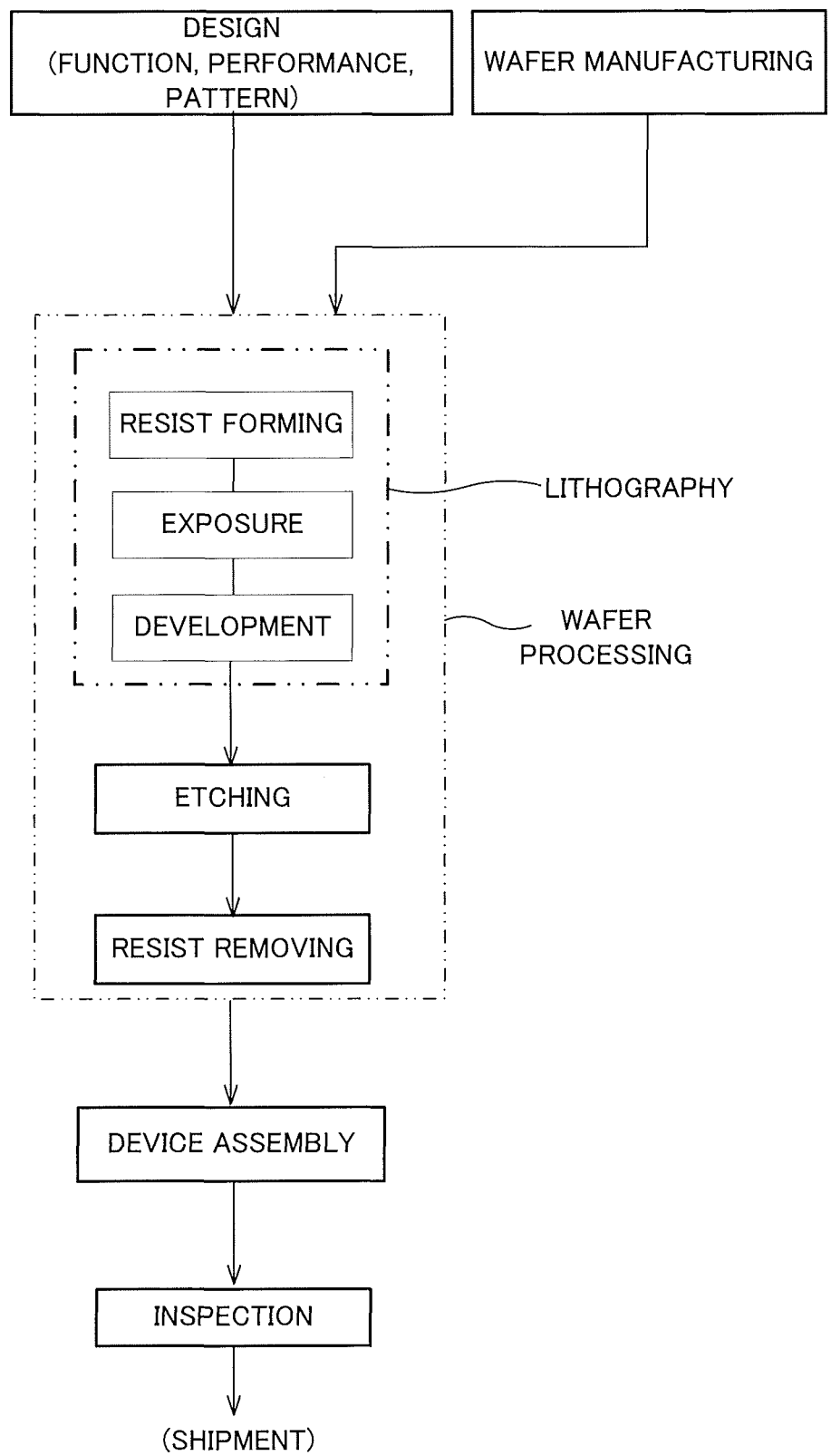
FIG. 14 is a flowchart used to describe an embodiment of a device manufacturing method

Electronic devices (micro-devices) such as semiconductor devices, as is shown in FIG. 14, are manufactured through the steps such as; a step for performing function/performance design of a device, a step for making a wafer from silicon material, a wafer processing step for forming actual circuits and the like on a wafer using lithography technique and the like, a device assembly step (including a dicing process, a bonding process, and a packaging process), and an inspection step. The wafer processing step includes steps such as a lithography step (a process for coating a resist (sensitive material) on a wafer, a process for performing exposure (drawing a pattern according to a designed pattern data) with respect to a wafer by the electron beam exposure apparatus and the exposure method according to the embodiment described earlier, and a process for developing the wafer that has been exposed), an etching step for removing by etching an exposed member of an area other than the area where the resist remains, and a resist removing step for removing the resist that is no longer necessary since etching has been completed. The wafer processing step, prior to the lithography step, may further include a pre-process processing (an oxidation step, a CVD step, an electrode forming step, an ion implantation step and the like). In this case, in the lithography step, since the device pattern is formed on the wafer by carrying out the exposure method described earlier using electron beam exposure apparatus 100 in the embodiment described above, highly integrated micro-devices can be manufactured with good productivity (high yield). Especially by performing the complementary lithography described earlier in the lithography step (the process in which exposure is performed), and by carrying out the exposure method described earlier using electron beam exposure apparatus 100 described in the embodiment above in the lithography step, it becomes possible to manufacture micro-devices with higher integration.

Note that the international publication and disclosures of the U.S. patents related to the exposure apparatus and the like quoted in the embodiments above, in their entirety, are incorporated herein by reference as a part of the present specification.

INDUSTRIAL APPLICABILITY

As is described so far, the exposure apparatus and the exposure method, the lithography method, and the device manufacturing method according to the present invention is suitable for manufacturing micro-devices.

REFERENCE SIGNS LIST

W . . . wafer,
100 . . . electron beam exposure apparatus,
85*b* . . . fine movement stage,
28 . . . beam forming aperture plate,
28*a* . . . aperture,
20 . . . multibeam optical system,
92 . . . electron beam irradiation device,
50 . . . main controller,
$200_1$ to $200_{10}$ . . . distortion tables.

The invention claimed is:

1. An exposure apparatus that irradiates a plurality of beams of charged particles to expose a target, comprising:
   a stage that is movable and holds the target;
   an irradiation device that has a multibeam optical system which emits the plurality of beams to be irradiated on the target and in which an irradiation state of each of the plurality of beams can be individually set; and
   a controller that controls relative movement between the stage and the multibeam optical system, and also adjusts an irradiation position of the plurality of beams with respect to the target, wherein
   the irradiation position of the plurality of beams with respect to the target is adjusted by controlling irradiation timing of the plurality of beams based on information concerning change in an irradiation position of a second beam of the plurality of beams, the change occurring based on an irradiation state of at least a first beam of the plurality of beams in accordance with change in a relative position between the stage and the multibeam optical system.

2. The exposure apparatus according to claim 1, wherein the irradiation state of a beam of the plurality of beams is one of an on state in which the beam is irradiated on the target and an off state in which the beam is not irradiated on the target.

3. The exposure apparatus according to claim 1, wherein the irradiation state of a beam of the plurality of beams includes an irradiation current amount of the beam.

4. The exposure apparatus according to claim 1, wherein the information concerning change in the irradiation position of the second beam is information obtained by performing one of a simulation and an experiment in advance.

5. The exposure apparatus according to claim 4, wherein the controller adjusts the irradiation position of the plurality of beams, based on a plurality of correction tables acquired by obtaining information concerning change in the irradiation position of the second beam for each combination of the irradiation state of the plurality of beams.

6. The exposure apparatus according to claim 5, wherein the plurality of correction tables includes the same number of correction tables as the plurality of beams, including information concerning change of an irradiation position of the plurality of beams that occur when the irradiation state of the plurality of beams are changed in each of the beams.

7. The exposure apparatus according to claim 1, further comprising:
a measurement system which obtains position information of the stage, wherein
the controller, by controlling the irradiation timing of the plurality of beams based on the information concerning change of the irradiation position of the second beam and the position information obtained by the measurement system, adjusts the irradiation position of the plurality of beams with respect to the target while moving the stage.

8. The exposure apparatus according to claim 7, wherein the controller adjusts the irradiation position of the plurality of beams in an arrangement direction of the plurality of beams so that irradiation position shift in the arrangement direction is averaged.

9. The exposure apparatus according to claim 1, wherein the plurality of beams is formed by the beams passing through a plurality of apertures of a beam forming member, and in the beam forming member, position of the plurality of apertures is adjusted at a manufacturing stage so that the irradiation position of each of the plurality of beams having passed through the plurality of apertures on the target is positioned on a straight line in an arrangement direction of the plurality of apertures.

10. The exposure apparatus according to claim 1, wherein the irradiation position is a position on an irradiation surface on which the beam is irradiated.

11. A lithography method, comprising:
exposing a target with an exposure apparatus and forming a line-and-space pattern on the target; and
performing cutting of a line pattern that structures the line-and-space pattern using the exposure apparatus according to claim 1.

12. A device manufacturing method including a lithography process, wherein
in the lithography process, exposure with respect to the target is performed by the lithography method according to claim 11.

13. An exposure method of irradiating and exposing a target with a plurality of beams of charged particles, comprising:
holding the target on a stage that is movable within a predetermined plane;
irradiating the plurality of beams on the target from an irradiation device having a multibeam optical system in which an irradiation state of each of the plurality of beams can be individually set; and
controlling relative movement between the stage and the multibeam optical system, and adjusting an irradiation position of the plurality of beams with respect to the target, wherein
the irradiation position of the plurality of beams with respect to the target is adjusted by controlling irradiation timing of the plurality of beams based on information concerning change in an irradiation position of a second beam of the plurality of beams, the change occurring based on an irradiation state of at least a first beam of the plurality of beams in accordance with change in a relative position between the stage and the multibeam optical system.

14. The exposure method according to claim 13, wherein the irradiation state of a beam of the plurality of beams is one of an on state in which the beam is irradiated on the target and an off state in which the beam is not irradiated on the target.

15. The exposure method according to claim 13, wherein the irradiation state of a beam of the plurality of beams includes an irradiation current amount of the beam.

16. The exposure method according to claim 13, wherein the information concerning change in the irradiation position of the second beam is information obtained by performing one of a simulation and an experiment in advance.

17. The exposure method according to claim 16, wherein in the adjusting, the irradiation position of the plurality of beams is adjusted, based on a plurality of correction tables acquired by obtaining information concerning change in the irradiation position of the second beam for each combination of the irradiation state of the plurality of beams.

18. The exposure method according to claim 17, wherein the plurality of correction tables includes the same number of correction tables as the plurality of beams, including information concerning change of an irradiation position of the plurality of beams that occur when the irradiation state of the plurality of beams are changed in each of the beams.

19. The exposure method according to claim 13, further comprising:
obtaining position information of the stage, wherein
by controlling the irradiation timing of the plurality of beams based on the information concerning change of the irradiation position of the second beam and the position information obtained, the irradiation position of the plurality of beams with respect to the target is adjusted, while moving the stage.

20. The exposure method according to claim 19, wherein in the adjusting, the irradiation position of the plurality of beams in an arrangement direction of the plurality of beams is adjusted so that irradiation position shift in the arrangement direction is averaged.

21. The exposure method according to claim 13, wherein the plurality of beams is formed by the beams passing through a plurality of apertures of a beam forming member, and in the beam forming member, position of the plurality of apertures is adjusted at a manufacturing stage so that the irradiation position of each of the plurality of beams having passed through the plurality of apertures on the target is positioned on a straight line in an arrangement direction of the plurality of apertures.

22. The exposure method according to claim 13, wherein the irradiation position is a position on an irradiation surface on which the beam is irradiated.

23. A lithography method, comprising:
exposing a target with an exposure apparatus and forming a line-and-space pattern on the target; and
performing cutting of a line pattern that structures the line-and-space pattern using the exposure method according to claim 13.

24. A device manufacturing method including a lithography process, wherein in the lithography process, exposure with respect to the target is performed by the lithography method according to claim 23.

\* \* \* \* \*